US011963402B2

(12) United States Patent
Kanehiro et al.

(10) Patent No.: US 11,963,402 B2
(45) Date of Patent: Apr. 16, 2024

(54) DISPLAY DEVICE HAVING AUXILIARY WIRING LINE ELECTRICALLY CONNECTED TO METAL NANOWIRE

(71) Applicant: SHARP KABUSHIKI KAISHA, Sakai (JP)

(72) Inventors: Masayuki Kanehiro, Sakai (JP); Youhei Nakanishi, Sakai (JP); Takeshi Ishida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 294 days.

(21) Appl. No.: 17/438,134

(22) PCT Filed: Mar. 25, 2019

(86) PCT No.: PCT/JP2019/012587
§ 371 (c)(1),
(2) Date: Sep. 10, 2021

(87) PCT Pub. No.: WO2020/194466
PCT Pub. Date: Oct. 1, 2020

(65) Prior Publication Data
US 2022/0173178 A1 Jun. 2, 2022

(51) Int. Cl.
*H10K 59/122* (2023.01)
*H10K 50/84* (2023.01)
(Continued)

(52) U.S. Cl.
CPC ......... *H10K 59/122* (2023.02); *H10K 50/841* (2023.02); *H10K 59/131* (2023.02); *H10K 59/35* (2023.02)

(58) Field of Classification Search
CPC .. H10K 59/122; H10K 59/131; H10K 50/841; H10K 59/35
See application file for complete search history.

(56) References Cited

U.S. PATENT DOCUMENTS

2003/0137325 A1 7/2003 Yamazaki et al.
2008/0197778 A1 8/2008 Kubota
(Continued)

FOREIGN PATENT DOCUMENTS

JP 2008-216975 A 9/2008
JP 2010-009753 A 1/2010
(Continued)

*Primary Examiner* — Michael Jung
(74) *Attorney, Agent, or Firm* — ScienBiziP, P.C.

(57) ABSTRACT

A display device includes a light-emitting element layer including a plurality of light-emitting elements. The light-emitting element layer includes, for each of the plurality of light-emitting elements, a first electrode and a plurality of openings exposing the first electrode, and includes an edge cover covering an end portion of the first electrode, a plurality of light-emitting layers covering each of the plurality of openings, and a second electrode that is common to the plurality of light-emitting elements and covers the plurality of light-emitting layers. The second electrode includes a metal nanowire. Furthermore, the light-emitting element layer includes an auxiliary wiring line provided in a lattice pattern in a position overlapping the edge cover, and the auxiliary wiring line and the metal nanowire are electrically connected to each other.

20 Claims, 18 Drawing Sheets

(51) Int. Cl.
    *H10K 59/131*     (2023.01)
    *H10K 59/35*     (2023.01)

(56) References Cited

U.S. PATENT DOCUMENTS

| | | | |
|---|---|---|---|
| 2009/0200936 A1* | 8/2009 | Kang | H10K 50/805 |
| | | | 445/25 |
| 2010/0302221 A1 | 12/2010 | Okumoto | |
| 2012/0074397 A1 | 3/2012 | Okumoto | |
| 2014/0110674 A1* | 4/2014 | Choe | H10K 59/1315 |
| | | | 257/89 |
| 2017/0104181 A1* | 4/2017 | Lee | H10K 59/122 |
| 2020/0136075 A1 | 4/2020 | Kanehiro et al. | |
| 2020/0357353 A1* | 11/2020 | Lee | G09G 3/3688 |

FOREIGN PATENT DOCUMENTS

| | | |
|---|---|---|
| JP | 2012-086393 A | 5/2012 |
| JP | 2014-197558 A | 10/2014 |
| WO | 2010/070798 A1 | 6/2010 |
| WO | 2018/235727 A1 | 12/2018 |

\* cited by examiner

DISPLAY DEVICE HAVING AUXILIARY WIRING LINE ELECTRICALLY CONNECTED TO METAL NANOWIRE

TECHNICAL FIELD

The disclosure relates to a display device including a light-emitting element.

BACKGROUND ART

PTL 1 discloses a display device in which a common electrode common to a plurality of pixel electrodes and an auxiliary wiring line in the same layer as the pixel electrodes are connected to each other via a contact hole.

CITATION LIST

Patent Literature

PTL 1: WO2010/070798 A1

SUMMARY

Technical Problem

As in the display device disclosed in PTL 1, when a common electrode and an auxiliary wiring line are electrically connected to each other via a contact hole, formation of a light-emitting layer and the like needs to be performed while avoiding the contact hole, which requires high positional accuracy and is disadvantageous to an improvement in resolution.

Solution to Problem

To solve the problem described above, a display device according to the present application includes: a display region including, on a substrate, a TFT layer, a light-emitting element layer including a plurality of light-emitting elements, and a sealing layer in this order; and a frame region around the display region, wherein the light-emitting element layer includes, for each of the plurality of light-emitting elements, a first electrode and a plurality of openings exposing the first electrode, and includes an edge cover covering an end portion of the first electrode, a plurality of light-emitting layers covering each of the plurality of openings, and a second electrode that is common to the plurality of light-emitting elements and covers the plurality of light-emitting layers, the second electrode includes a metal nanowire, and the light-emitting element layer further includes an auxiliary wiring line in a lattice pattern in a position overlapping the edge cover, and the auxiliary wiring line and the metal nanowire are electrically connected to each other.

Advantageous Effects of Disclosure

According to the configuration described above, the common electrode and the auxiliary wiring line of the display device can be electrically connected to each other without having a contact hole therebetween, and a display device advantageous to an improvement in resolution can be provided.

DESCRIPTION OF EMBODIMENTS

First Embodiment

In the following, "same layer" means being formed of the same material in the same process. In addition, "lower layer" means a layer that is formed in a process prior to that of a comparison layer, and "upper layer" means a layer that is formed in a process after that of a comparison layer. In this specification, a direction from a lower layer to an upper layer of a display device will be described as an upward direction.

Figure 1:
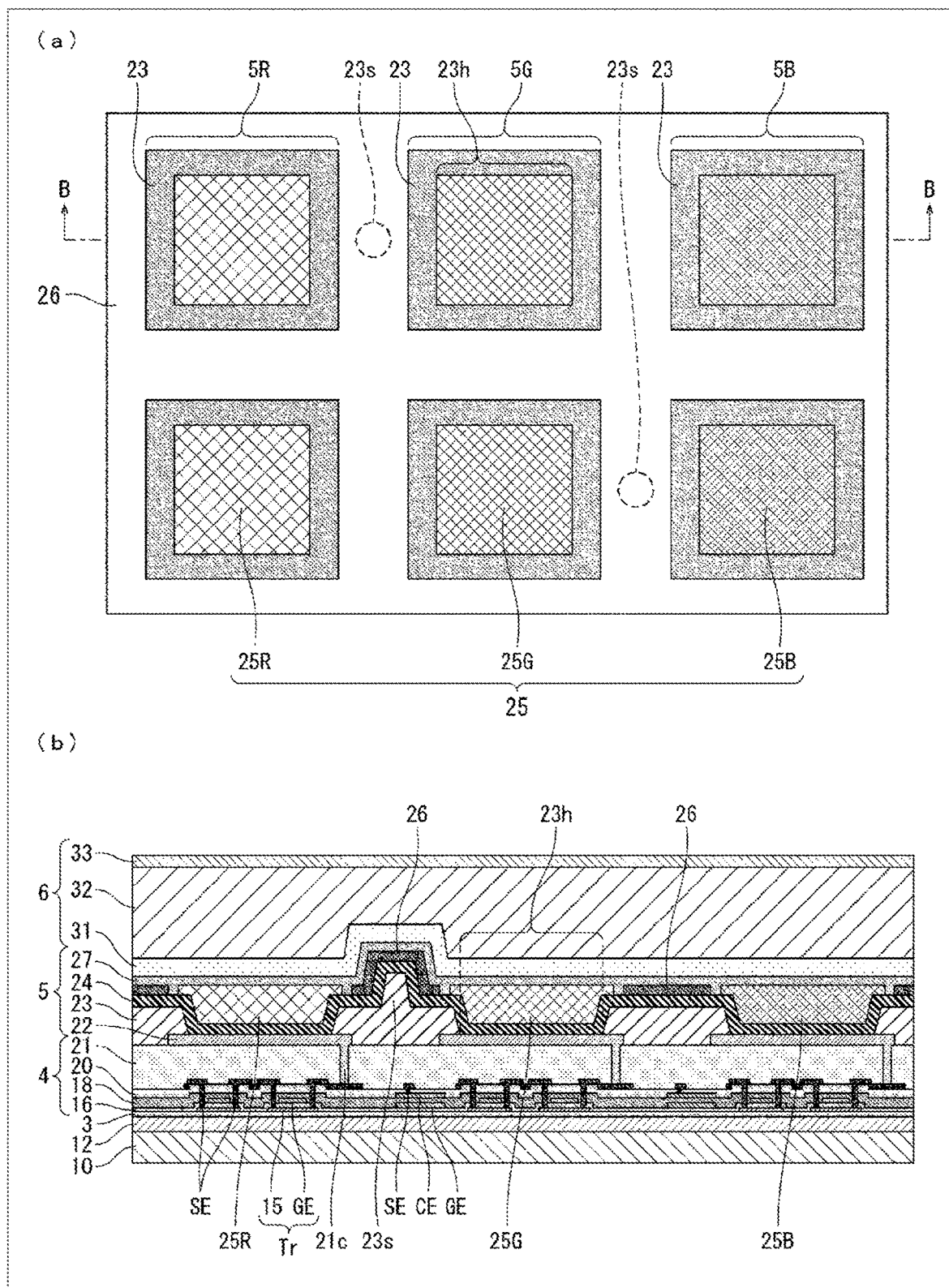
FIG. 1 is a top enlarged view and a side cross-sectional view of a display region of a display device according to a first embodiment.
Figure 2:
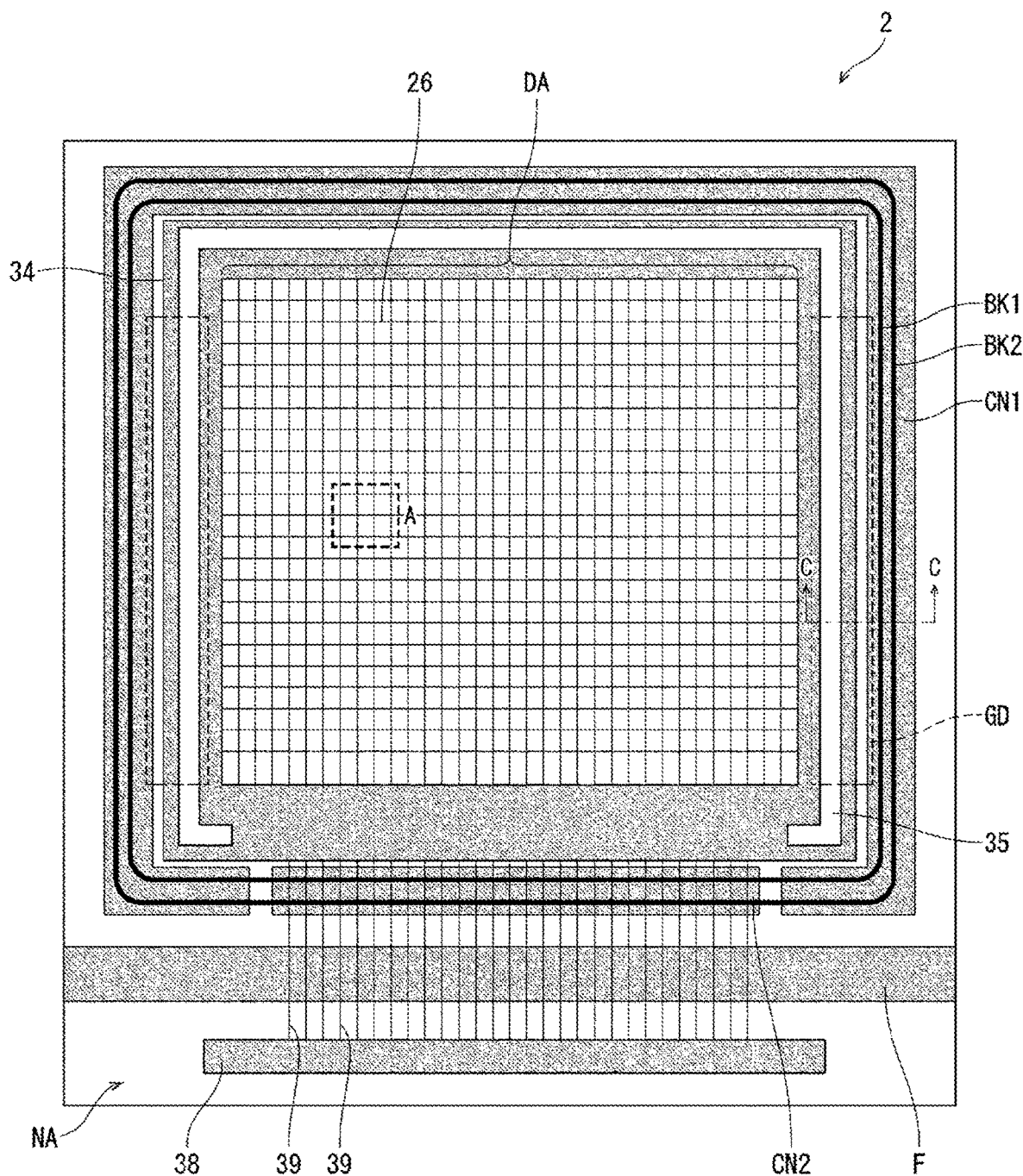
FIG. 2 is a top perspective view of the display device according to the first embodiment.
Figure 3:
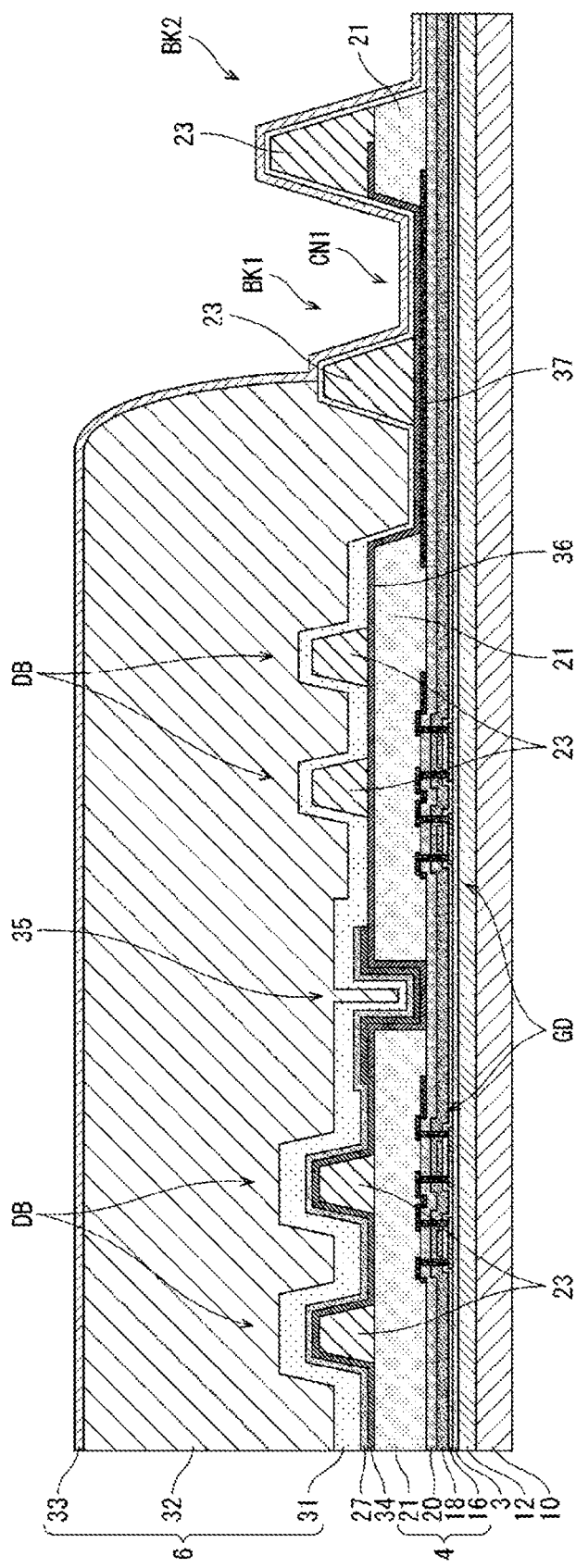
FIG. 3 is a side cross-sectional view of a frame region of the display device according to the first embodiment.

A display device 2 according to the present embodiment will be described with reference to FIGS. 1 to 3. FIG. 2 is a top view of the display device 2 according to the present embodiment. (a) of FIG. 1 is an enlarged top view of a region A in FIG. 2, and (b) of FIG. 1 is a cross-sectional view viewed in the direction of the arrows along line B-B in (a) of FIG. 1. FIG. 3 is a cross-sectional view viewed in the direction of the arrows along line C-C in FIG. 2.

As illustrated in FIG. 2, the display device 2 according to the present embodiment includes a display region DA and a frame region NA provided adjacent to the periphery of the display region DA. With reference to FIG. 1, a structure in the display region DA of the display device 2 according to the present embodiment will be explained in detail. Note that illustration of a hole transport layer 24, a second electrode 27, and a sealing layer 6, which will be described later in detail, is omitted in (a) of FIG. 1.

As illustrated in (b) of FIG. 1, the display device 2 according to the present embodiment includes a support substrate 10, a resin layer 12, a barrier layer 3, a TFT layer (thin film transistor layer) 4, a light-emitting element layer 5, and the sealing layer 6 in this order from the lower layer. In a further upper layer overlying the sealing layer 6, the display device 2 may be provided with a function film or the like having an optical compensation function, a touch sensor function, a protection function, and the like.

The support substrate 10 may be, for example, a flexible substrate such as a PET film, or a rigid substrate such as a glass substrate. A material of the resin layer 12 may be, for example, polyimide.

The barrier layer 3 is a layer for preventing foreign matter such as water and oxygen from penetrating into the TFT layer 4 and the light-emitting element layer 5 during usage of the display device. The barrier layer 3 may be constituted by, for example, a silicon oxide film, a silicon nitride film, or a silicon oxynitride film, which are formed by CVD, or a layered film thereof.

The TFT layer 4 includes a semiconductor layer 15, a first inorganic layer 16 (gate insulating film), a gate electrode GE, a second inorganic layer 18, a capacitance wiring electrode CE, a third inorganic layer 20, a source wiring line SE (metal wiring line layer), and a flattening film 21 (interlayer insulating film) in this order from the lower layer. A thin film transistor (TFT) Tr is configured to include the semiconductor layer 15, the first inorganic layer 16, and the gate electrode GE.

The semiconductor layer 15 is composed of, for example, low-temperature polysilicon (LTPS) or an oxide semiconductor. Although the TFT is illustrated in FIG. 2 as having the semiconductor layer 15 as a channel and having a top gate structure, the TFT may have a bottom gate structure (for example, in a case where the channel of the TFT is an oxide semiconductor).

The gate electrode GE, the capacitance electrode CE, and the source wiring line SE may include, for example, at least one of aluminum (Al), tungsten (W), molybdenum (Mo), tantalum (Ta), chromium (Cr), titanium (Ti), and copper (Cu). Furthermore, the gate electrode GE, the capacitance electrode CE, or the source wiring line SE is constituted by a single-layer film or a layered film of any of the metals described above. Particularly, in the present embodiment, the gate electrode GE contains Mo, and the source wiring line SE contains Al.

The first inorganic layer 16, the second inorganic layer 18, and the third inorganic layer 20 can be configured by a silicon oxide (SiOx) film or a silicon nitride (SiNx) film, or a layered film thereof, formed using CVD, for example. The flattening film 21 can be composed of a coatable photosensitive organic material such as polyimide or acryl. A contact hole 21c is formed in a position of the flattening film 21 overlapping the source wiring line SE of the thin film transistor Tr.

The light-emitting element layer 5 (for example, an organic light-emitting diode layer) includes a first electrode 22, an edge cover 23 covering an edge of the first electrode 22, the hole transport layer 24, a light-emitting layer 25, an auxiliary wiring line 26, and the second electrode 27 in this order from the lower layer.

In the present embodiment, as illustrated in (a) of FIG. 1, the light-emitting element layer 5 includes, as a plurality of light-emitting elements, a red light-emitting element 5R including a red light-emitting layer 25R, a green light-emitting element 5G including a green light-emitting layer 25G, and a blue light-emitting element 5B including a blue light-emitting layer 25B. The light-emitting element layer 5 includes, for each of the plurality of light-emitting elements, the first electrode 22 and the light-emitting layer 25 in an island shape, and further includes the hole transport layer 24 common to the plurality of light-emitting elements, and the second electrode 27 common to the plurality of light-emitting elements.

In a plan view, the first electrode 22 is provided in a position overlapping the flattening film 21 and the contact hole 21c. The first electrode 22 is electrically connected to the source wiring line SE via the contact hole 21c. Thus, a signal in the TFT layer 4 is supplied to the first electrode 22 via the source wiring line SE. Note that the thickness of the first electrode 22 may be 100 nm, for example. In the present embodiment, the first electrode 22 is formed by, for example, the layering of Indium Tin Oxide (ITO) and an alloy containing Ag and has light reflectivity.

The edge cover 23 is an organic insulating film, and includes an organic material such as polyimide or acryl, for example. The edge cover 23 is formed in a position covering the edge of the first electrode 22. The edge cover 23 includes an opening 23h for each of the plurality of light-emitting elements, and a part of the first electrode 22 is exposed from the edge cover 23. Note that a spacer 23s of the edge cover 23 having a greater film thickness than the other edge cover 23 may be formed in a position that does not overlap the first electrode 22.

In the present embodiment, the hole transport layer 24 is formed to be common to the plurality of light-emitting elements in a position overlapping the edge cover 23 and the first electrode 22 exposed from the opening 23h. The hole transport layer 24 is an inorganic hole transport layer, and includes, for example, NiO or MgNiO as a hole transport material.

The light-emitting layer 25 is formed for each of the plurality of light-emitting elements in a position covering each of the openings 23h. In the present embodiment, the light-emitting layer 25 includes, for each of the plurality of light-emitting elements, the red light-emitting layer 25R, the green light-emitting layer 25G, and the blue light-emitting layer 25B described above.

In the present embodiment, the auxiliary wiring line 26 is formed in a position overlapping the edge cover 23. As illustrated in (a) of FIG. 1, the auxiliary wiring line 26 is provided in a lattice pattern. Note that, in the present embodiment, the auxiliary wiring line 26 is not limited to a shape in which the plurality of linear auxiliary wiring lines 26 arranged at substantially equal intervals perpendicularly intersect each other, as illustrated in (a) of FIG. 1. For example, like PenTile, an interval between the adjacent auxiliary wiring lines 26 may vary depending on a position, and the auxiliary wiring lines 26 may intersect each other at an angle.

A material of the auxiliary wiring line 26 may be silver. Silver is generally a material used in a backplane of a display device, such as a metal layer of the TFT layer 4, and silver included in the auxiliary wiring line 26 can be used as a material for forming the backplane upon formation of the auxiliary wiring line 26. In addition, the auxiliary wiring line 26 may include Al or Cu alone, have a layered structure of Ti/Al/Ti, or have a layered structure of W/Ta.

In the present embodiment, the hole transport layer 24 and the auxiliary wiring line 26 are formed on the sealing layer 6 side of the edge cover 23. Thus, the hole transport layer 24 and the auxiliary wiring line 26 are in contact with each other.

The second electrode 27 is formed as a common electrode common to the plurality of light-emitting elements, and covers the light-emitting layer 25. The second electrode 27 includes a metal nanowire, and has high translucency. The metal nanowire included in the second electrode 27 may be, for example, a silver nanowire. In addition, the second electrode 27 may include a conductive metal nanowire such as a gold nanowire or a copper nanowire. Furthermore, the second electrode 27 is also formed in a position overlapping the auxiliary wiring line 26 on the edge cover 23. Therefore, the metal nanowire included in the second electrode 27 is electrically connected to the auxiliary wiring line 26.

In the present embodiment, the second electrode 27 may include an electron transport material. The electron transport material included in the second electrode 27 may adopt a material generally used in the electron transport layer of the light-emitting element, and may be, for example, ZnO or MgZnO. Particularly, a material of the second electrode 27 may be a mixed material obtained by mixing a silver nanowire dispersion and a ZnO nanoparticle dispersion. Further, the mixed material may include a binder, a dispersing agent, or other additives. In this way, the second electrode 27 has electron transport properties, and has a function of the electron transport layer.

The sealing layer 6 includes a first inorganic sealing film 31 above the second electrode 27, an organic sealing film 32 above the first inorganic sealing film 31, and a second inorganic sealing film 33 above the organic sealing film 32, and prevents foreign matter such as water and oxygen from penetrating into the light-emitting element layer 5. The first inorganic sealing film 31 and the second inorganic sealing film 33 can be composed of, for example, a silicon oxide film, a silicon nitride film, or a silicon oxynitride film formed by CVD, or a layered film thereof. The organic sealing film 32 can be formed of a coatable photosensitive organic material such as a polyimide or an acrylic.

Next, each configuration in the frame region NA around the display region DA will be described with reference to FIG. 2 and FIG. 3. FIG. 3 is a cross-sectional view viewed in the direction of the arrows along line C-C in FIG. 2, and illustrates each member in the frame region NA adjacent to the periphery of the display region DA of the display device 2 according to the present embodiment.

As illustrated in FIG. 3, the display device 2 may also include the support substrate 10, the resin layer 12, the barrier layer 3, the TFT layer 4, and the sealing layer 6 in the frame region NA.

The display device 2 may also include, in the frame region NA, a dummy bank DB formed of the edge cover 23 illustrated in FIG. 3. The dummy bank DB may be used as a spacer used for forming a common layer in the display region DA and abutted by a CVD mask or the like.

Furthermore, the display device 2 may include, in the frame region NA, a first bank BK1 formed of the edge cover 23, and a second bank BK2 formed of the flattening film 21 and the edge cover 23, as illustrated in FIG. 2 and FIG. 3. The first bank BK1 and the second bank BK2 are formed into a frame-like shape around the display region DA. The first bank BK1 and the second bank BK2 regulate wet-spreading of the organic sealing film 32 due to coating the organic sealing film 32 with the sealing layer 6, which is a higher layer than the organic sealing film 32. For example, in FIG. 3, the first bank BK1 abuts an end portion of the organic sealing film 32 to regulate wet-spreading of the organic sealing film 32.

As illustrated in FIG. 2 and FIG. 3, the display device 2 includes a stem wiring line 34 between the flattening film 21 and the second electrode 27 in the frame region NA. As illustrated in FIG. 2, the auxiliary wiring line 26 branches from the stem wiring line 34, and extends from the frame region NA to the display region DA.

As illustrated in FIG. 2 and FIG. 3, a slit 35 being an opening of the flattening film 21 may be formed in the frame region NA in a position surrounding a part of the periphery of the display region DA. By forming the TFT of the TFT layer 4 on the display region DA side of the slit 35 and the peripheral side of the display device 2, a gate driver monolithic GD illustrated in FIG. 2 and FIG. 3 may be formed. Note that the slit 35 may not be necessarily formed.

Here, as illustrated in FIG. 3, the stem wiring line 34, together with the second electrode 27, extends farther to the peripheral side of the display device 2 than the slit 35, which includes the inside of the slit 35. As illustrated in FIG. 2, a conductive film 36 that is of the same material as that of the first electrode 22 and that is in the same layer as the first electrode 22 is formed in the frame region NA. The conductive film 36 extends from the display region DA side closer than the slit 35 in the frame region NA, passes through the inside of the slit 35, and extends farther to the peripheral side of the display device 2 than the slit 35. Thus, the stem wiring line 34 and the conductive film 36 are electrically connected to each other in a position including the inside of the slit 35.

The conductive film 36 further extends to a position overlapping the first bank BK1 and the second bank BK2. In the position overlapping the first bank BK1 and the second bank BK2, a source conductive film 37 that is of the same material as that of the source wiring line SE of the TFT layer 4 and that is in the same layer is formed. Thus, the conductive film 36 and the source conductive film 37 are connected to each other at a first connection portion CN1 in a position including a portion between the first bank BK1 and the second bank BK2.

As illustrated in FIG. 2, the display device 2 includes a terminal portion 38 in the frame region NA. The terminal portion 38 is formed around the second bank BK2. A driver (not illustrated) that supplies a signal for driving each of the light-emitting elements in the display region DA via a lead wiring line 39, and the like are mounted on the terminal portion 38. In a position in which the lead wiring line 39 is formed around four sides of the display region DA, the slit 35 may not be formed.

Note that the source conductive film 37 is also formed in a position overlapping the lead wiring line 39 and overlapping the first bank BK1 and the second bank BK2. Thus, the lead wiring line 39 and the source conductive film 37 are connected to each other at a second connection portion CN2 in a position overlapping the lead wiring line 39 and including a portion between the first bank BK1 and the second bank BK2.

The source conductive film 37 at the first connection portion CN1 and the source conductive film 37 at the second connection portion CN2 are electrically conductive. Therefore, an electrical connection between a high-voltage power supply and the stem wiring line 34, and thus an electrical connection between the high-voltage power supply and the auxiliary wiring line 26 are established via the lead wiring line 39, the source conductive film 37, and the conductive film 36. Thus, the auxiliary wiring line 26 is electrically connected to both of the high-voltage power supply and the second electrode 27, and has the effect of reducing a voltage drop in the second electrode 27 in a position away from the high-voltage power supply.

Note that, when the support substrate 10 is a flexible substrate, as illustrated in FIG. 2, the display device 2 may include a bending portion F formed along an outer periphery of the display device 2 between the second bank BK2 and the terminal portion 38. In the actual display device 2, the peripheral side of the display device 2 from the bending portion F including the terminal portion 38 may be folded back to the back surface side of the display device 2 by being bent by the bending portion F.

Figure 4:
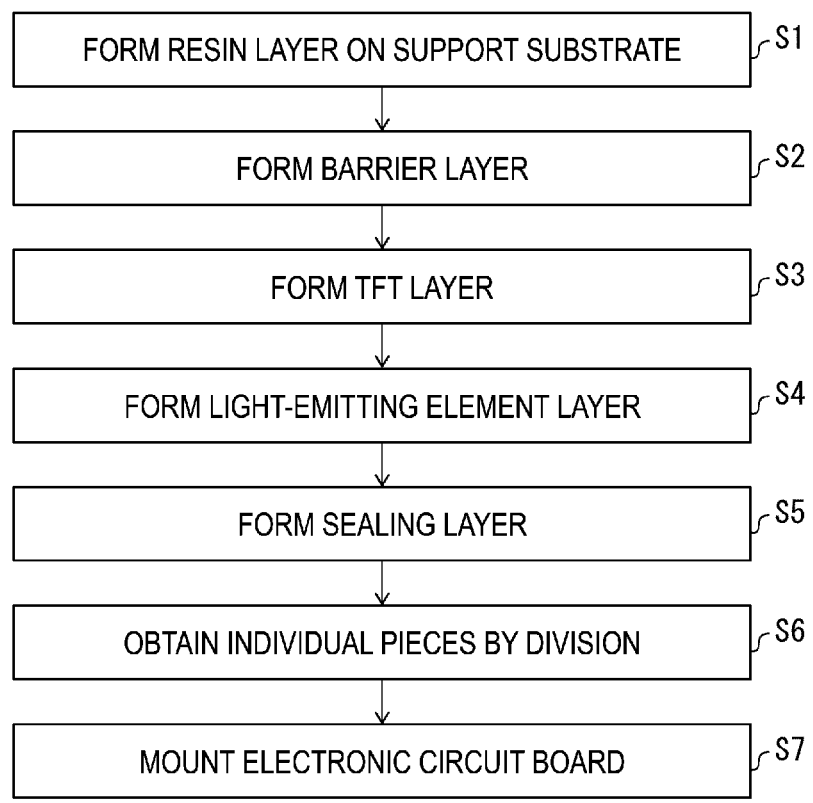
FIG. 4 is a flowchart illustrating a manufacturing method for the display device according to the first embodiment.

Next, a manufacturing method for the display device 2 according to the present embodiment will be described in detail with reference to FIG. 4. FIG. 4 is a flowchart illustrating each manufacturing step of the display device 2 according to the present embodiment.

First, the resin layer 12 is formed on a transparent support substrate (for example, a mother glass substrate) (step S1). Next, the barrier layer 3 is formed in an upper layer overlying the resin layer 12 (step S2). Next, the TFT layer 4 is formed in an upper layer overlying the barrier layer 3 (step S3). When forming each of the layers from step S1 to step S3, a known film formation method in the related art can be employed.

Note that, in step S3, formation of the source conductive film 37 may be performed together with formation of the source wiring line SE. Further, formation of the slit 35 and formation of a part of the second bank BK2 may be performed together with formation of the flattening film 21. Furthermore, a transistor included in the gate driver monolithic GD may be formed together with formation of the thin film transistor Tr in the TFT layer 4.

Figure 5:
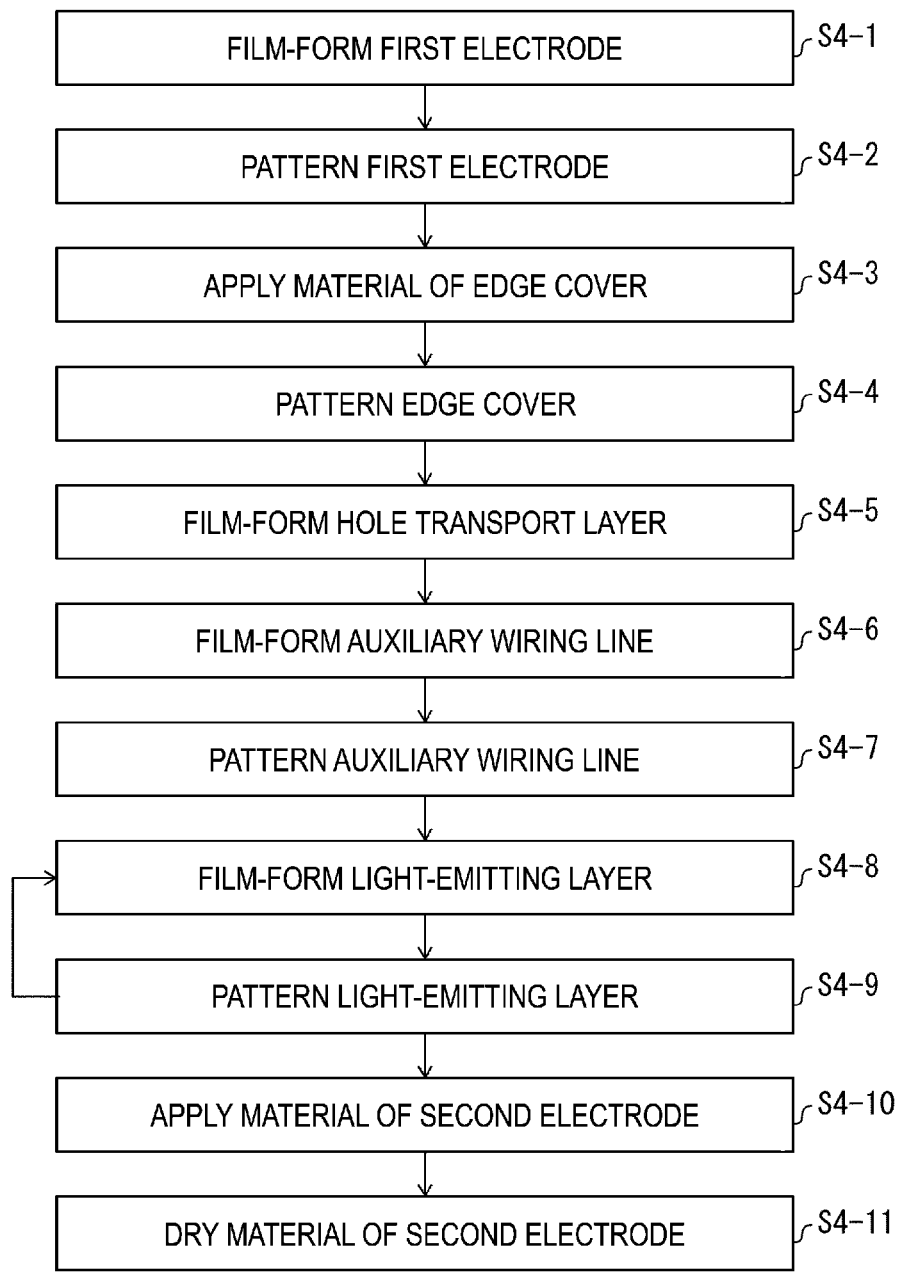
FIG. 5 is a flowchart illustrating in more detail formation of a light-emitting element layer in the manufacturing method for the display device according to the first embodiment.
Figure 6:
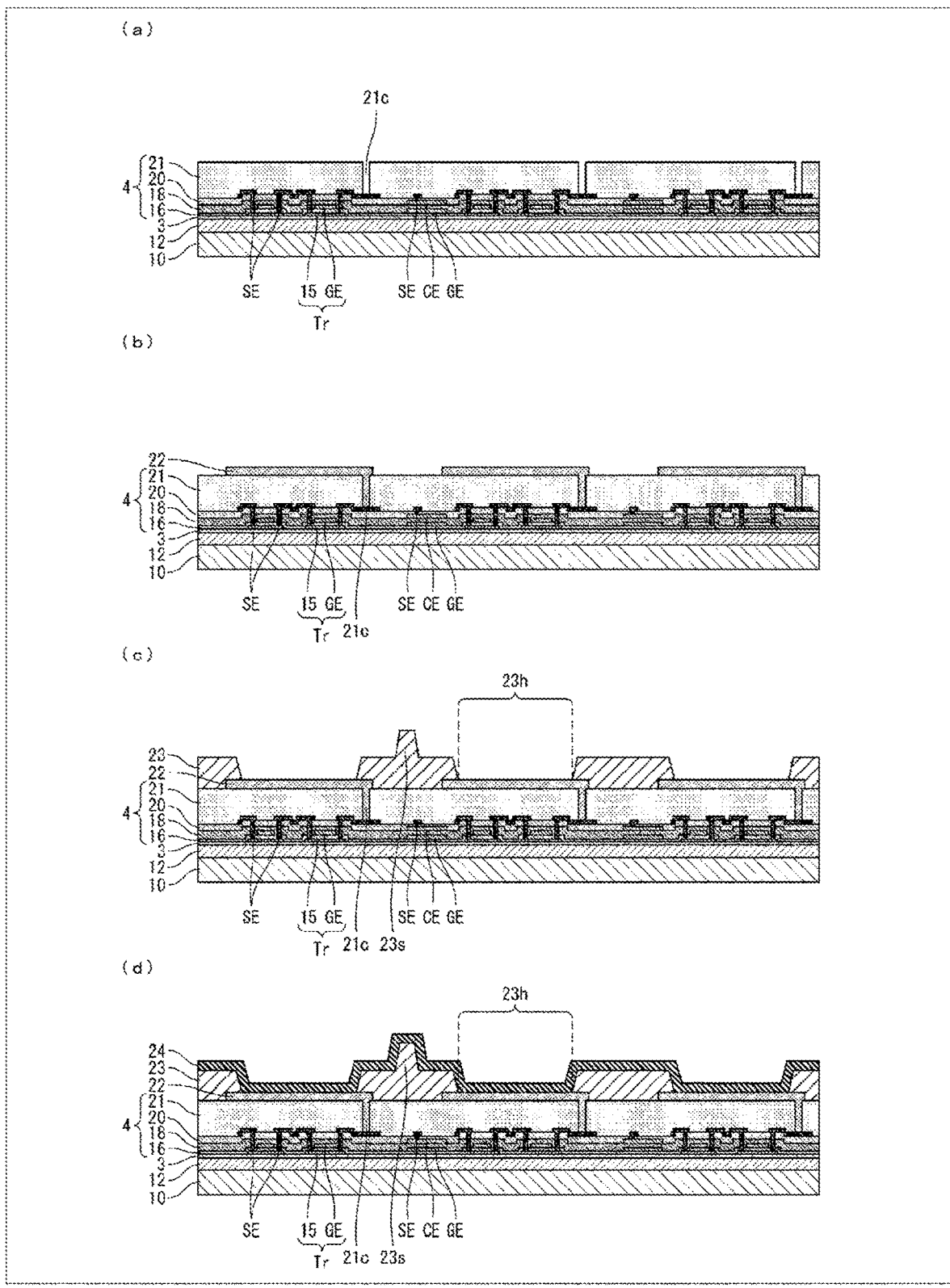
FIG. 6 is a step cross-sectional view illustrating the manufacturing method for the display device according to the first embodiment.
Figure 7:
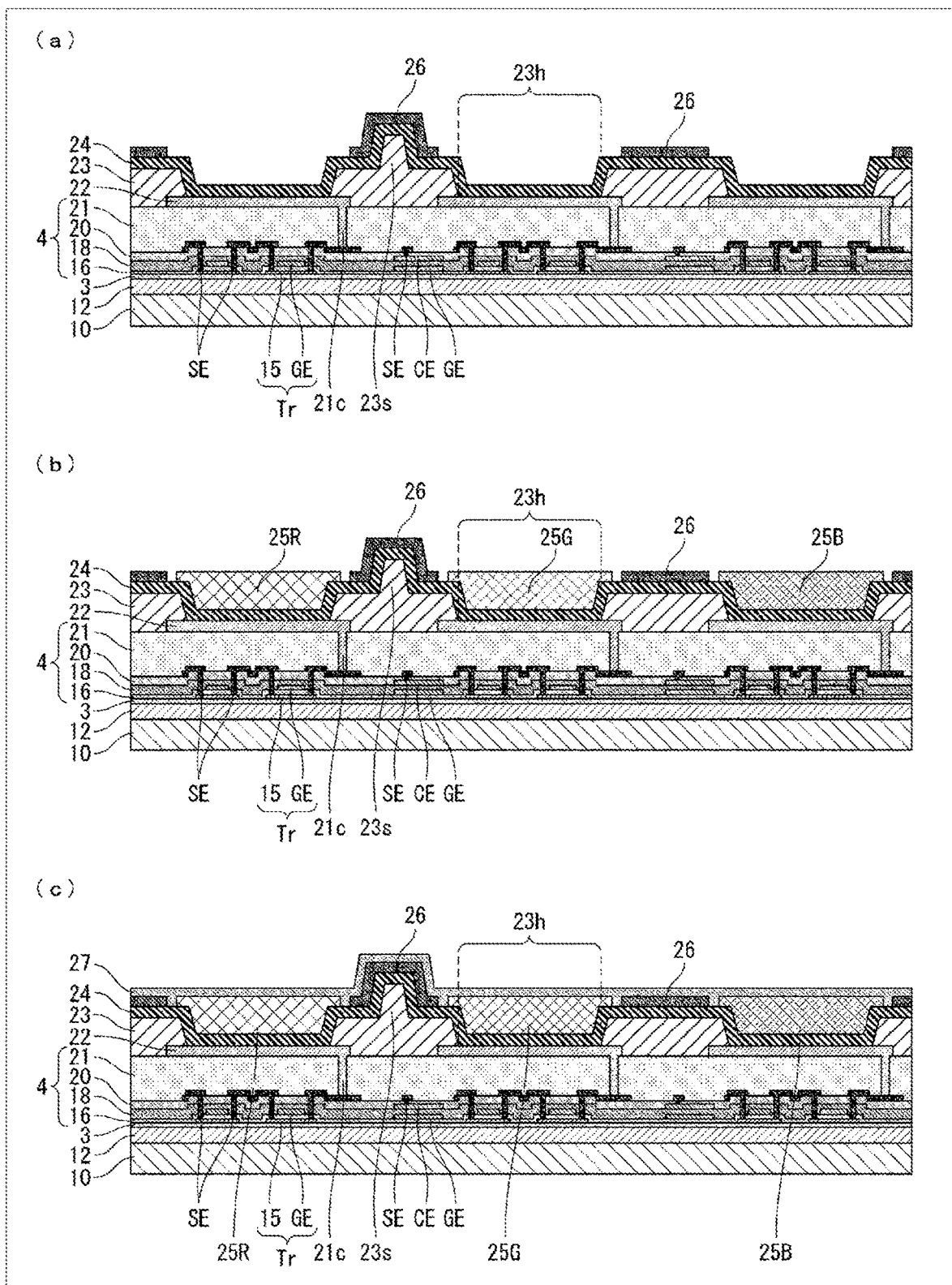
FIG. 7 is another step cross-sectional view illustrating the manufacturing method for the display device according to the first embodiment.

Next, the light-emitting element layer 5 is formed in an upper layer overlying the TFT layer 4 (step S4). The method for forming each of the layers in step S4 will be described in more detail with reference to FIGS. 5 to 7. FIG. 5 is a flowchart illustrating the steps of forming the light-emitting element layer 5 in the present embodiment. FIG. 6 and FIG. 7 are step cross-sectional views for describing the steps of forming the light-emitting element layer 5 in more detail, which are executed based on the flowchart in FIG. 5. Note that, all subsequent step cross-sectional views including FIG. 6 and FIG. 7 illustrate step cross-sectional views in a position corresponding to (b) of FIG. 1.

Execution up to step S3 results in a structure illustrated in (a) of FIG. 6. In step S4, first, the first electrode 22 is film-formed (step S4-1). A sputtering method or the like can be employed for forming the first electrode 22. Note that, in step S4-1, film formation of the conductive film 36 is also performed.

Next, the first electrode 22 is patterned into individual electrodes (step S4-2). An etching method using photolithography or the like can be employed for patterning the first electrode 22. Execution of step S4-2 results in individual first electrodes 22 illustrated in (b) of FIG. 6. Note that, in step S4-2, patterning of the conductive film 36 is also performed.

Next, a material of the edge cover 23 is applied to a position including the upper layer of the first electrode 22 (step S4-3). A known technique for applying an organic material in the related art can be employed for applying a material of the edge cover 23. The material of the edge cover 23 is also applied to the frame region NA.

Next, the edge cover 23 is patterned (step S4-4). For example, patterning of the edge cover 23 can be performed using photolithography by adding a photosensitive resin to the material of the edge cover 23. Further, photolithography using a halftone mask may be performed to form the spacer 23s.

In this way, as illustrated in (c) of FIG. 6, the edge cover 23 including the spacer 23s is obtained. Note that, by patterning the edge cover 23, a part of the first electrode 22 except for the end portion thereof is exposed from the opening 23h of the edge cover 23. Note that, in step S4-4, formation of the dummy bank DB and the first bank BK1 is performed. Furthermore, in step S4-4, formation of a remaining part of the second bank BK2 is performed.

Next, as illustrated in (d) of FIG. 6, the hole transport layer 24 is film-formed in the upper layer of the first electrode 22 that is exposed from the edge cover 23 and the opening 23h (step S4-5). For the film formation of the hole transport layer 24, a sputtering method, an application firing method using a solution coating device, such as ink-jet and various coaters, a low-temperature CVD method using a CVD mask, or the like can be used.

Next, the auxiliary wiring line 26 is film-formed in the upper layer of the hole transport layer 24 (step S4-6). A sputtering method or the like can also be used for the film formation of the auxiliary wiring line 26. Note that, in step S4-6, film formation of the stem wiring line 34 is also performed.

Next, the auxiliary wiring line 26 is patterned (step S4-7). An etching method using photolithography or the like can be employed for patterning the auxiliary wiring line 26. Here, since the hole transport layer 24 is formed of an inorganic material, damage to the hole transport layer 24 and each of the layers being lower layers underlying the hole transport layer 24 due to patterning of the auxiliary wiring line 26 is reduced. Note that, in step S4-7, patterning of the stem wiring line 34 is also performed.

Next, the light-emitting layer 25 is formed. For the formation of the light-emitting layer 25, first, film formation of a light-emitting layer having any luminescent color in the light-emitting layer 25 is performed (step S4-8). For example, film formation of the red light-emitting layer 25R is performed by applying the material of the red light-emitting layer 25R to the upper layer of the hole transport layer 24 and the auxiliary wiring line 26.

Next, the film-formed red light-emitting layer 25R is patterned (step S4-9). Here, for example, a material in which quantum dots emitting red light are dispersed in a photosensitive material may be employed as the material of the red light-emitting layer 25R. In this way, the material of the applied red light-emitting layer 25R can be patterned by using photolithography. At this time, a photomask may abut the spacer 23s to perform photolithography of the red light-emitting layer 25R.

Step S4-8 and step S4-9 described above are repeatedly executed according to a type of the light-emitting layer 25. In this way, each of the red light-emitting layer 25R, the green light-emitting layer 25G, and the blue light-emitting layer 25B illustrated in (b) of FIG. 7 is formed in a position covering each of the openings 23h.

Note that, in the present embodiment, a method of patterning the light-emitting layer 25 by photolithography is given as an example, but no such limitation is intended. For example, the light-emitting layer 25 may be formed by direct patterning by an ink-jet method. In the present embodiment, an example is given in which the light-emitting layer 25 includes quantum dots, but no such limitation is intended. For example, the light-emitting layer 25 may include an organic EL material. In this case, the light-emitting layer 25 may be formed by vapor deposition of the organic EL material using a vapor deposition mask.

After the formation of the light-emitting layer 25, the second electrode 27 is formed. In the formation of the second electrode 27, first, ink of a metal nanowire mixed with an electron transport material is applied to a position covering the upper layer of each light-emitting layer 25 and the auxiliary wiring line 26 (step S4-10). Next, the applied ink of the metal nanowire is dried (step S4-11) to form the second electrode 27 illustrated in (c) of FIG. 7. The second electrode 27 is also formed in a position overlapping the auxiliary wiring line 26, and thus an electrical connection between the auxiliary wiring line 26 and the second electrode 27 is established. As described above, the steps of forming the light-emitting element layer 5 are completed.

After step S4, the sealing layer 6 is formed (step S5). Next, a layered body including the support substrate 10, the resin layer 12, the barrier layer 3, the TFT layer 4, the light-emitting element layer 5, and the sealing layer 6 is divided to obtain a plurality of individual pieces (step S6). Next, an electronic circuit board (an IC chip, for example) is mounted on the terminal portion 38 to configure the display device 2 (step S7).

Note that, in the present embodiment, the transparent glass substrate described above may be used as the support substrate 10 as it is. However, by adding some steps, the flexible display device 2 can be manufactured.

For example, after step S5, a bonding force between the transparent support substrate and the resin layer 12 is reduced by irradiating the lower face of the resin layer 12 with laser light over the support substrate, and the support substrate is peeled off from the resin layer 12. Next, a lower face film such as a PET film is bonded to the lower face of the resin layer 12 to configure the support substrate 10. After that, the processing proceeds to step S6, and then, the flexible display device 2 can be obtained. In this case, the terminal portion 38 side may be folded back from the bending portion F to the back surface side of the support substrate 10 between step S6 and step S7.

In the present embodiment, an electrical connection between the auxiliary wiring line 26 and the second electrode 27 can be established without having a contact hole therebetween. In the present embodiment, since the contact hole is not formed, the need for positional accuracy in forming a member such as the light-emitting layer 25 is reduced, and an improvement in resolution of the display device 2 can be more easily achieved.

In the present embodiment, the auxiliary wiring line 26 is provided in the lower layer underlying the second electrode 27. Thus, in the step of patterning the auxiliary wiring line 26, the second electrode 27 is not formed. Therefore, the second electrode 27 can be prevented from being damaged due to patterning of the auxiliary wiring line 26. Thus, in the present embodiment, a material that can be damaged due to patterning of the auxiliary wiring line 26, such as a metal nanowire, can be employed as a material of the second electrode 27.

Furthermore, in the present embodiment, the second electrode 27 includes an electron transport material. Thus, in the light-emitting element layer 5, an electron transport layer does not need to be formed between the light-emitting layer 25 and the second electrode 27. Thus, the manufacturing step of the display device 2 is more facilitated.

Here, when an electron transport layer is formed between the light-emitting layer 25 and the second electrode 27, the electron transport layer needs to be patterned and to not be formed in a position overlapping the auxiliary wiring line 26 in order to establish an electrical connection between the auxiliary wiring line 26 and the second electrode 27. In the present embodiment, since the electron transport layer is not formed, patterning of the electron transport layer is also not necessary.

Therefore, a material that can be damaged due to patterning, such as, for example, a silver nanowire or a nanomaterial in which nanoparticles of ZnO are dispersed, can be employed as the electron transport material. Furthermore, since the step of patterning is not necessary for forming the second electrode 27, damage to the second electrode 27 and each of the layers underlying the second electrode 27 can also be reduced.

Here, in general, the auxiliary wiring line 26 is preferably formed directly in the upper layer of a member having high adhesion with the auxiliary wiring line 26. Further, the adhesion between the auxiliary wiring line 26 and the member in contact with the auxiliary wiring line 26 varies depending on the materials of the two. In general, the adhesion between the auxiliary wiring line 26 and the hole transport layer 24 is higher than the adhesion between the auxiliary wiring line 26 and the edge cover 23. Thus, the display device 2 according to the present embodiment is preferable because a formation defect of the auxiliary wiring line 26, such as peeling of the auxiliary wiring line 26, can be reduced.

Second Embodiment

Figure 8:
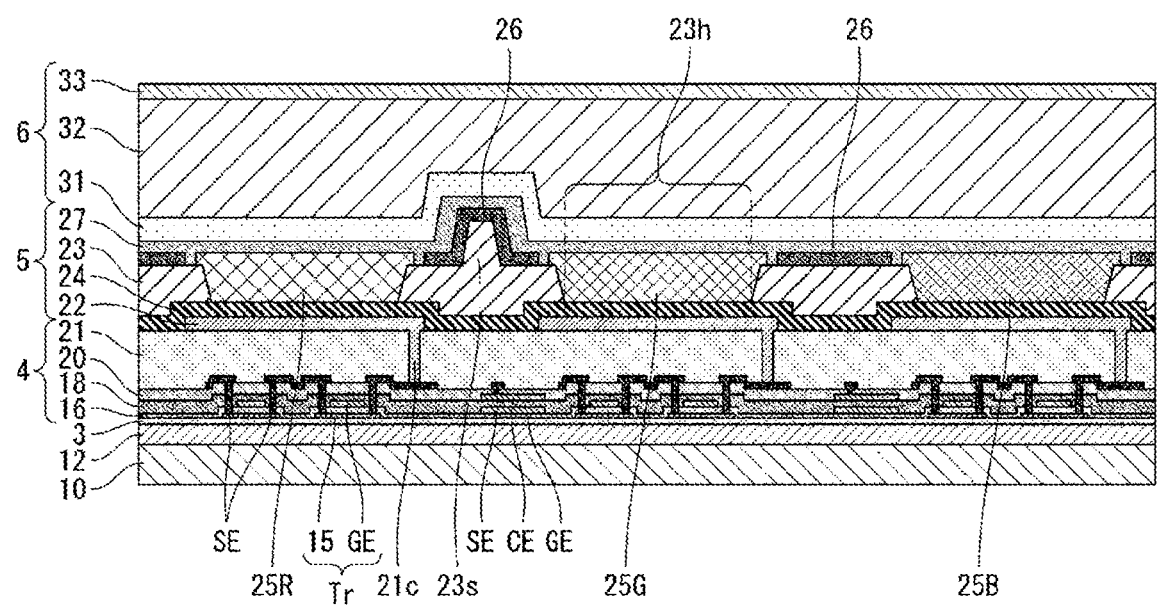
FIG. 8 is a side cross-sectional view of a display region of a display device according to a second embodiment.

FIG. 8 is a cross-sectional view, in the position corresponding to (b) of FIG. 1, of a display device 2 according to the present embodiment. In the display device 2 according to the present embodiment, a hole transport layer 24 is formed between a first electrode 22 and an edge cover 23 in comparison to the display device 2 according to the previous embodiment. In other words, in the present embodiment, the hole transport layer 24 is provided on a TFT layer 4 side of the edge cover 23.

In the present embodiment, the hole transport layer 24 is formed in common with the plurality of first electrodes 22 in an upper layer of the first electrode 22 and an upper layer of a flattening film 21. Particularly, the hole transport layer 24 is formed in a position covering an upper face and a side surface of the first electrode 22. Accordingly, the edge cover 23 is formed in an upper layer of the hole transport layer 24, and is formed in a position covering an end portion of the first electrode 22 in a plan view. A part of the first electrode 22 except for the end portion of the first electrode 22 is exposed from an opening 23h across the hole transport layer 24. An auxiliary wiring line 26 is also formed directly on the edge cover 23.

Except for the point described above, the display device 2 according to the present embodiment may have the same configuration as the display device 2 according to the previous embodiment.

Figure 9:
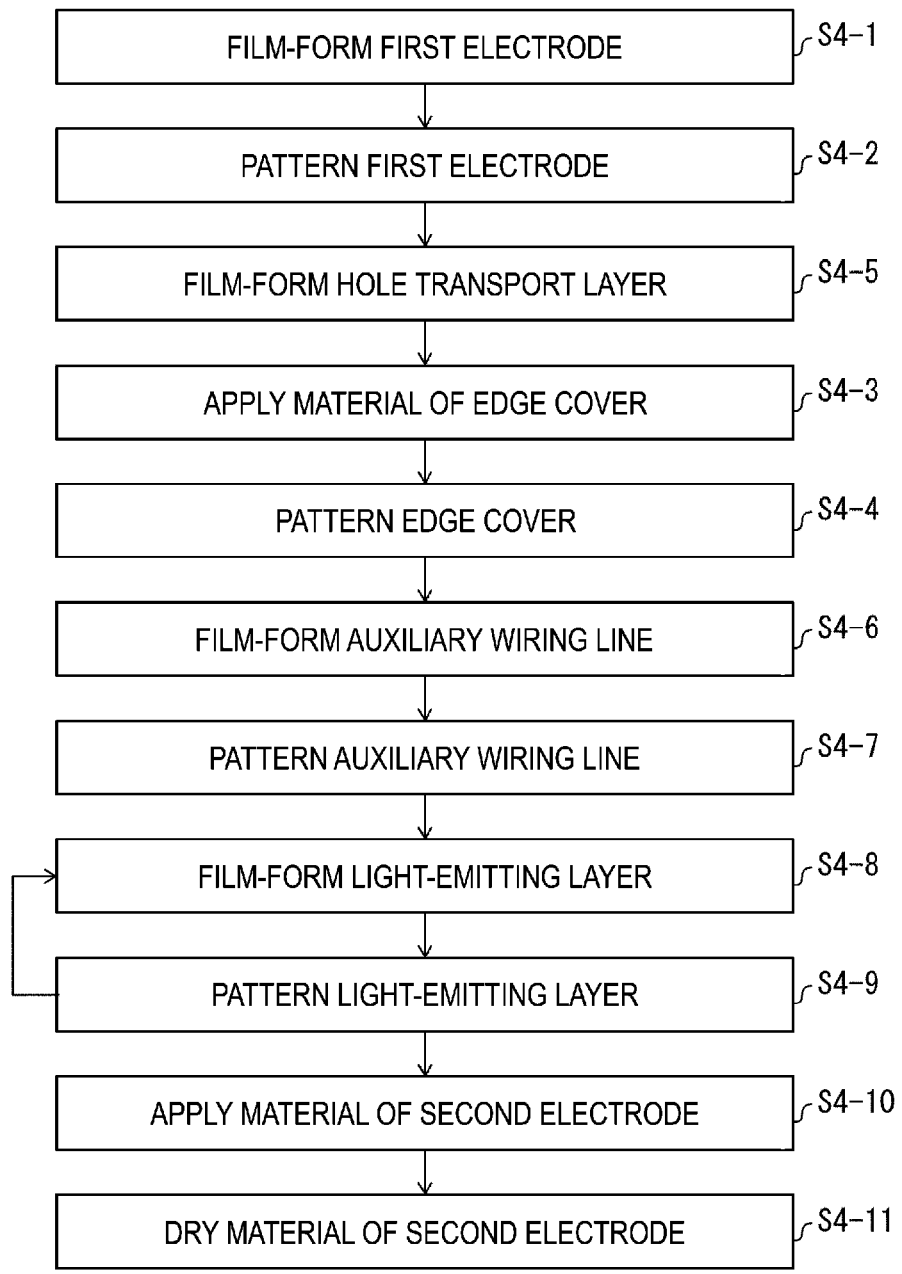
FIG. 9 is a flowchart illustrating in more detail formation of a light-emitting element layer in a manufacturing method for the display device according to the second embodiment.
Figure 10:
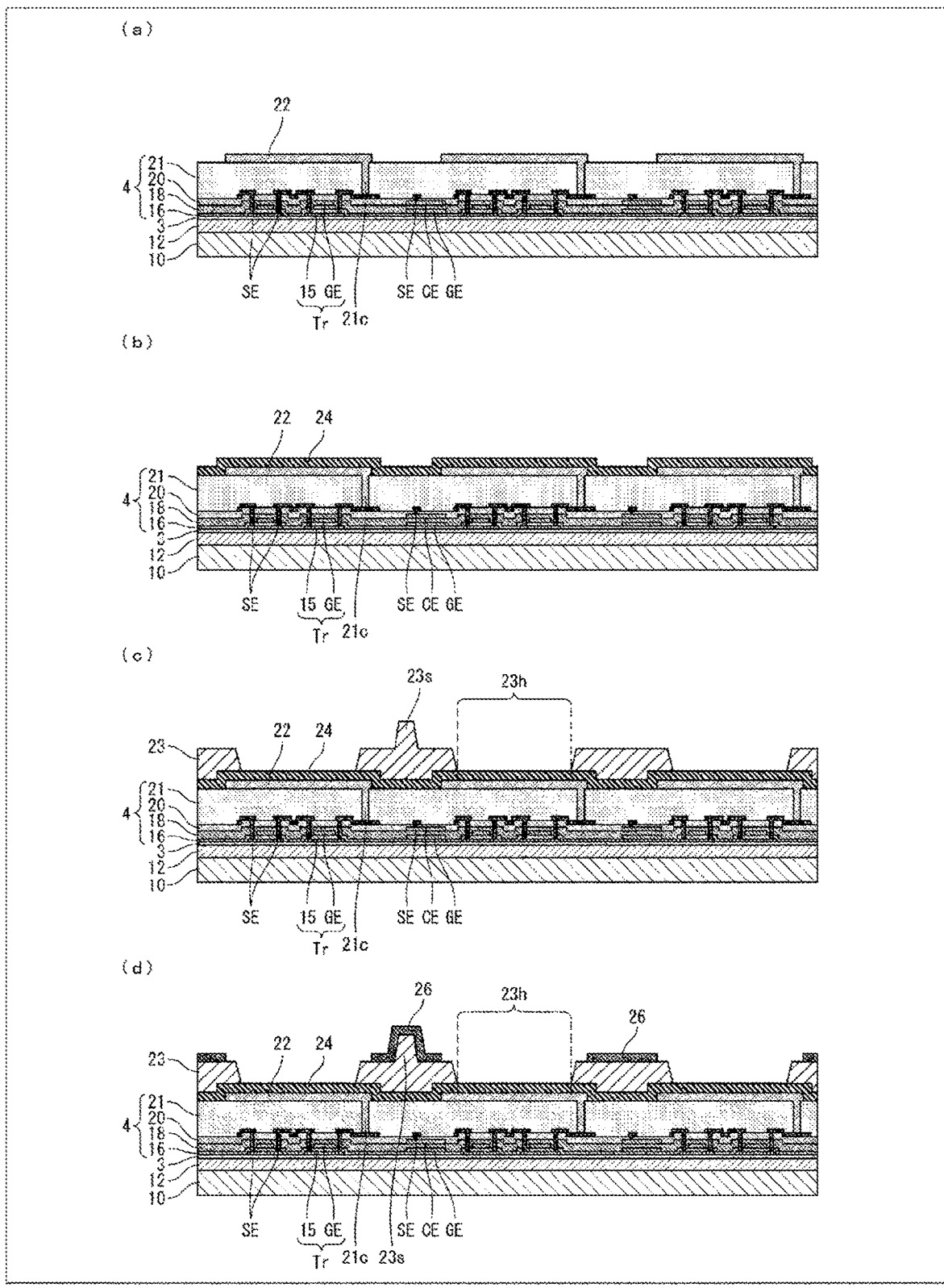
FIG. 10 is a step cross-sectional view illustrating the manufacturing method for the display device according to the second embodiment.

The display device 2 according to the present embodiment may be manufactured by the same method except for step S4 among the steps illustrated in the flowchart in FIG. 4. FIG. 9 is a flowchart for describing a method for forming a light-emitting element layer 5 of the display device 2 according to the present embodiment. FIG. 10 is a step cross-sectional view for describing steps of forming the light-emitting element layer 5 in more detail, which are executed based on the flowchart in FIG. 9.

As illustrated in FIG. 9, the steps of forming the light-emitting element layer 5 according to the present embodiment can be manufactured by the same method except that step S4-5 is executed after step S4-2 in comparison to the steps of forming the light-emitting element layer 5 according to the previous embodiment.

In the steps of forming the light-emitting element layer 5 according to the present embodiment, a structure illustrated in (a) of FIG. 10 is obtained by executing the steps up to step S4-2. Next, step S4-5 is executed, and the hole transport layer 24 is film-formed in the upper layer of the first electrode 22 and the flattening film 21 to obtain the hole transport layer 24 illustrated in (b) of FIG. 10. Next, step S4-3 and step S4-4 are executed sequentially to obtain the edge cover 23 in the upper layer of the hole transport layer 24 illustrated in (c) of FIG. 10. Next, step S4-6 and step S4-7 are executed sequentially to obtain the auxiliary wiring line 26 in direct contact with the edge cover 23 in the upper layer of the edge cover 23 illustrated in (d) of FIG. 10. Step S4-8 and subsequent steps are executed in the same manner as step S4-8 and the subsequent steps in the previous embodiment to obtain the light-emitting element layer 5 according to the present embodiment.

Also in the display device 2 according to the present embodiment, a contact hole does not need to be formed for establishing an electrical connection between the auxiliary wiring line 26 and a second electrode 27. Thus, the display device 2 according to the present embodiment is more advantageous to an improvement in resolution.

In the present embodiment, the edge cover 23 and the opening 23h are formed in the upper layer of the hole transport layer 24, and the opening 23h is covered by a light-emitting layer 25 in a top view. Therefore, the hole transport layer 24 is completely covered by the edge cover 23 and the light-emitting layer 25 in the top view. Thus, a short circuit between the hole transport layer 24 and the second electrode 27 can be suppressed, and it is advantageous to an improvement in yield.

Third Embodiment

Figure 11:
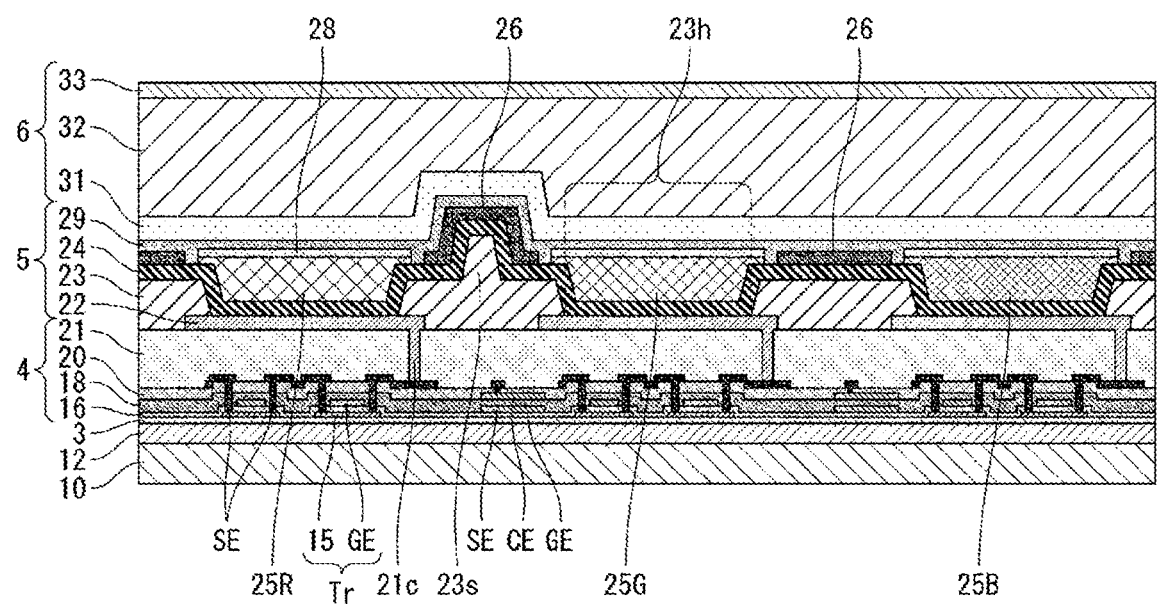
FIG. 11 is a side cross-sectional view of a display region of a display device according to a third embodiment.

FIG. 11 is a cross-sectional view, in the position corresponding to (b) of FIG. 1, of a display device 2 according to the present embodiment. In the display device 2 according to the present embodiment, a light-emitting element layer 5 further includes an electron transport layer 28 between a light-emitting layer 25 and a second electrode 27 in comparison to the display device 2 according to the first embodiment. The electron transport layer 28 is formed in an island shape for each of the plurality of light-emitting layers 25. The electron transport layer 28 includes an inorganic electron transport material such as ZnO or IGZO (In—Ga—Zn—O based oxide semiconductor). Note that, in the present embodiment, the light-emitting element layer 5 may include a second electrode 29 that does not include an electron transport material, instead of the second electrode 27. Except for the point described above, the display device 2 according to the present embodiment may have the same configuration as the display device 2 according to the first embodiment.

Figure 12:
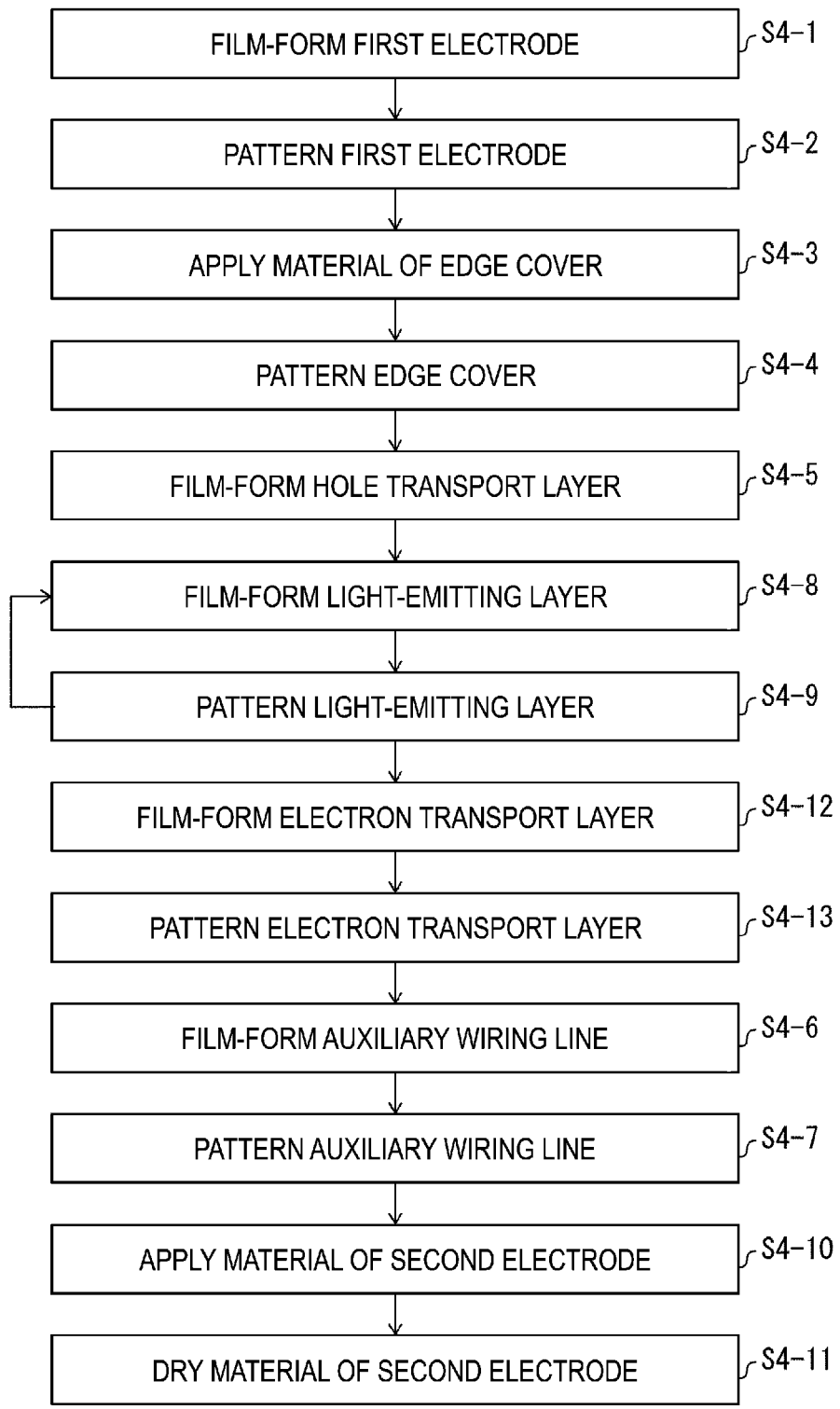
FIG. 12 is a flowchart illustrating in more detail formation of a light-emitting element layer in a manufacturing method for the display device according to the third embodiment.
Figure 13:
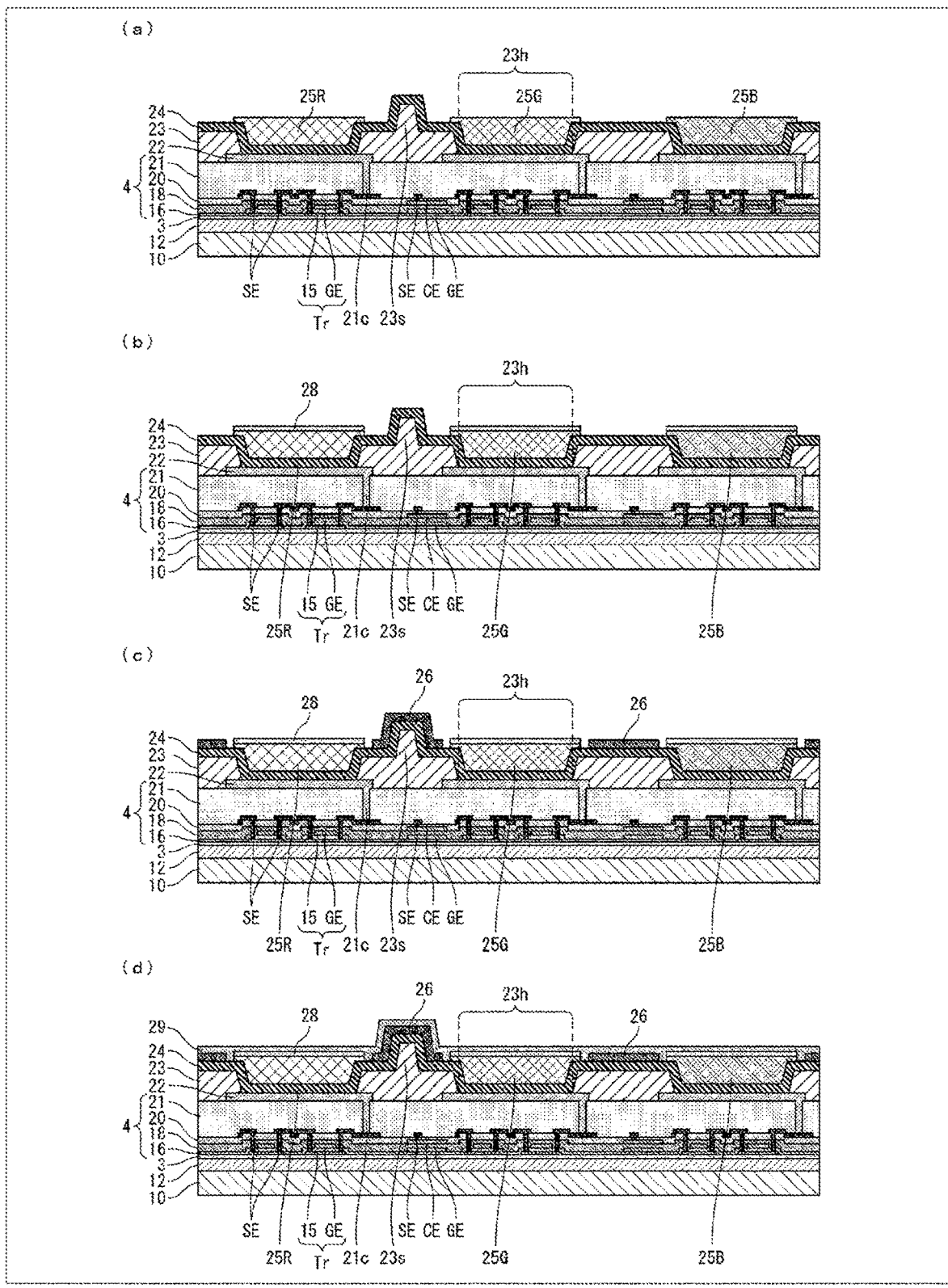
FIG. 13 is a step cross-sectional view illustrating the manufacturing method for the display device according to the third embodiment.

The display device 2 according to the present embodiment may be manufactured by the same method except for step S4 among the steps illustrated in the flowchart in FIG. 4. FIG. 12 is a flowchart for describing a method for forming the light-emitting element layer 5 of the display device 2 according to the present embodiment. FIG. 13 is a step cross-sectional view for describing steps of forming the light-emitting element layer 5 in more detail, which are executed based on the flowchart in FIG. 12.

As illustrated in FIG. 12, the steps of forming the light-emitting element layer 5 according to the present embodiment can be manufactured by the same method up to step S4-5 in comparison to the steps of forming the light-emitting element layer 5 according to the first embodiment. In the present embodiment, step S4-8 and step S4-9 are executed first after step S4-5 to form the light-emitting layer 25. At a point in time of completion of the formation of the light-emitting layer 25, a structure illustrated in (a) of FIG. 13 is obtained.

Next, the electron transport layer 28 is film-formed in an upper layer of a hole transport layer 24 and the light-emitting layer 25 (step S4-12). The film formation of the electron transport layer 28 may be executed by the same method as the film formation of the hole transport layer 24. Next, the electron transport layer 28 is patterned (step S4-13). The patterning of the electron transport layer 28 may be performed by photolithography. In this way, the electron transport layer 28 formed in an island shape is obtained in a position covering each of the light-emitting layers 25 illustrated in (b) of FIG. 13.

Next, step S4-6 and step S4-7 are executed sequentially to form an auxiliary wiring line 26 illustrated in (c) of FIG. 13. Here, since the hole transport layer 24 and the electron transport layer 28 are both formed of an inorganic material, damage to the hole transport layer 24, the electron transport layer 28, and the layers underlying these layers is reduced in step S4-7.

Next, step S4-10 and step S4-11 are executed sequentially to form the second electrode 29 illustrated in (d) of FIG. 13. At this time, since the electron transport layer 28 is not present in an upper layer of the auxiliary wiring line 26, an electrical connection between the auxiliary wiring line 26 and the second electrode 29 is also established in the present embodiment. As described above, the light-emitting element layer 5 according to the present embodiment is formed.

Also in the display device 2 according to the present embodiment, a contact hole does not need to be formed for establishing an electrical connection between the auxiliary wiring line 26 and the second electrode 29. Thus, the display device 2 according to the present embodiment is more advantageous to an improvement in resolution.

Further, the electron transport layer 28 is formed separately from the second electrode 29, and the second electrode 29 does not need to include an electron transport material. Thus, electrical conductivity of the second electrode 29 is increased.

Note that, in the present embodiment, an example is given in which the electron transport layer 28 is formed of the same material in the upper layer of all the light-emitting layers 25, but no such limitation is intended. For example, similarly to the light-emitting layer 25, a material may also be changed for the electron transport layer 28 according to a luminescent color of the underlying light-emitting layer 25. In this case, the electron transport layer 28 may be formed by repeatedly performing the film formation and patterning of the electron transport layer 28 according to a luminescent color of the light-emitting layer 25. According to the configuration described above, the electron transport layer 28 including a more appropriate material can be formed for each light-emitting layer 25 according to a luminescent color of the light-emitting layer 25, and luminous efficiency of each light-emitting element is improved.

In the present embodiment, a configuration in which the individual electron transport layer 28 is formed for each light-emitting layer 25 is described as an example, but no such limitation is intended. The display device 2 according to the present embodiment may include a common electron transport layer 28 between some of the light-emitting layers 25 as long as an electrical connection between the auxiliary wiring line 26 and the second electrode 29 is established. For example, the electron transport layer 28 may be formed in common in the same type of light-emitting layers 25 adjacent to each other, and may be formed in common between a red light-emitting layer 25R and a blue light-emitting layer 25B, or between the red light-emitting layer 25R and a green light-emitting layer 25G.

Fourth Embodiment

Figure 14:
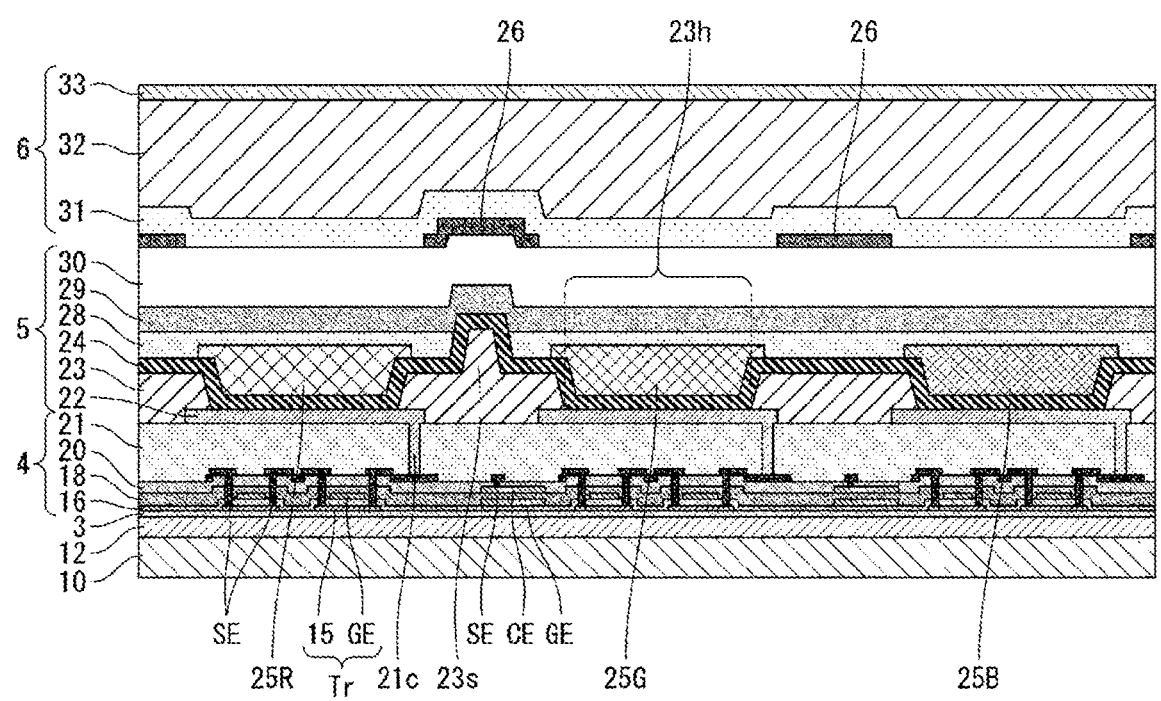
FIG. 14 is a side cross-sectional view of a display region of a display device according to a fourth embodiment.

FIG. 14 is a cross-sectional view, in the position corresponding to (b) of FIG. 1, of a display device 2 according to the present embodiment. In the display device 2 according to the present embodiment, a light-emitting element layer 5 includes an electron transport layer 28 common to a plurality of light-emitting elements in comparison to the display device 2 according to the previous embodiment. Furthermore, the light-emitting element layer 5 according to the present embodiment includes a transparent conductive film 30 in an upper layer of a second electrode 29. In addition, in the present embodiment, an auxiliary wiring line 26 is formed in a position overlapping an edge cover 23 in an upper layer of the transparent conductive film 30. Except for the point described above, the display device 2 according to the present embodiment may have the same configuration as the display device 2 according to the previous embodiment.

The transparent conductive film 30 is electrically connected to both of the auxiliary wiring line 26 and the second electrode 29. Thus, the auxiliary wiring line 26 is electrically connected to a silver nanowire of the second electrode 29 via the transparent conductive film 30. Further, the transparent conductive film 30 is formed in a position covering all of an upper face and a side surface of a first electrode 22. The transparent conductive film 30 may include, for example, ITO or Indium Zinc Oxide (IZO).

Figure 15:
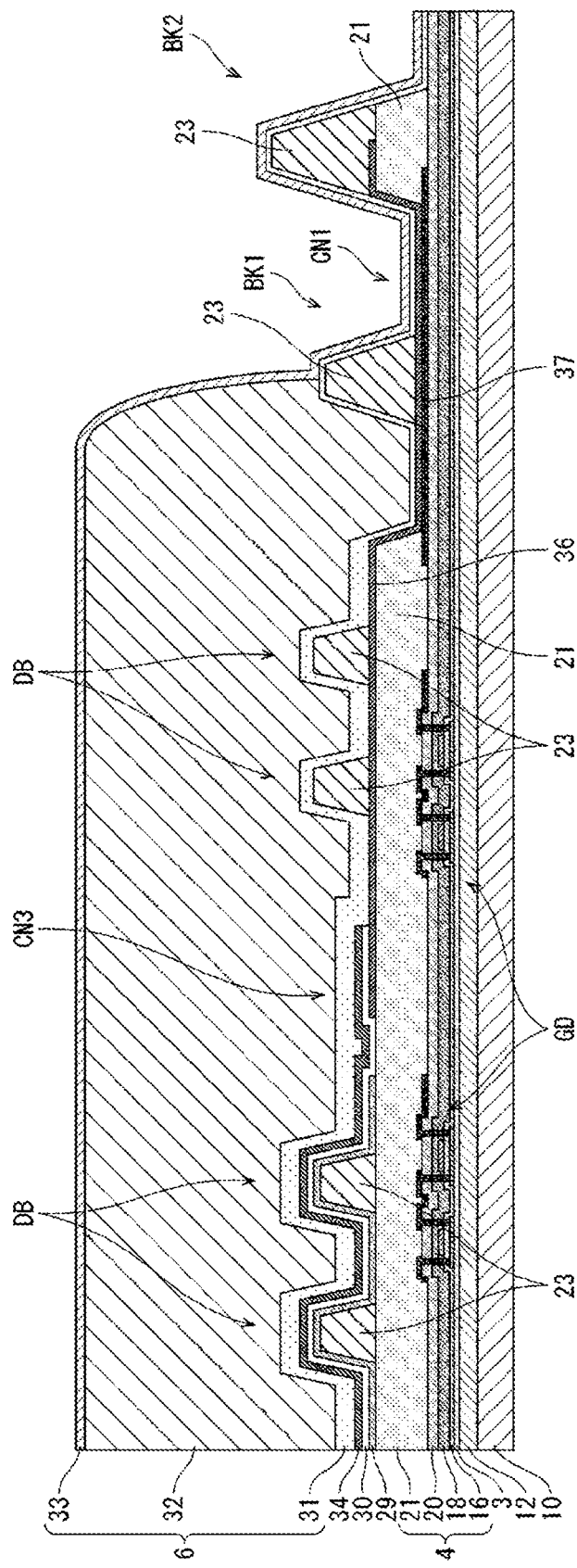
FIG. 15 is a side cross-sectional view of a frame region of the display device according to the fourth embodiment.

FIG. 15 is a cross-sectional view, in the position corresponding to (b) of FIG. 1, of the display device 2 according to the present embodiment. Note that, in the present embodiment, a configuration in which a slit 35 is not provided in a flattening film 21 in a frame region NA will be described as an example.

In the frame region NA, as illustrated in FIG. 15, the second electrode 29, the transparent conductive film 30, and a stem wiring line 34 are sequentially formed on the flattening film 21 in this order from the lower layer. Here, the transparent conductive film 30 and the stem wiring line 34 extend to the peripheral side of the display device 2 and are formed to a position overlapping a conductive film 36.

Particularly, in the present embodiment, as illustrated in FIG. 15, the transparent conductive film 30 and the conductive film 36 are in contact with each other and are electrically connected to each other at a third connection portion CN3 formed between dummy banks DB. Thus, in the present embodiment, the stem wiring line 34 is electrically connected to the conductive film 36 via the transparent conductive film 30. Note that, as illustrated in FIG. 15, the second electrode 29 may not extend to the position overlapping the conductive film 36.

Figure 16:
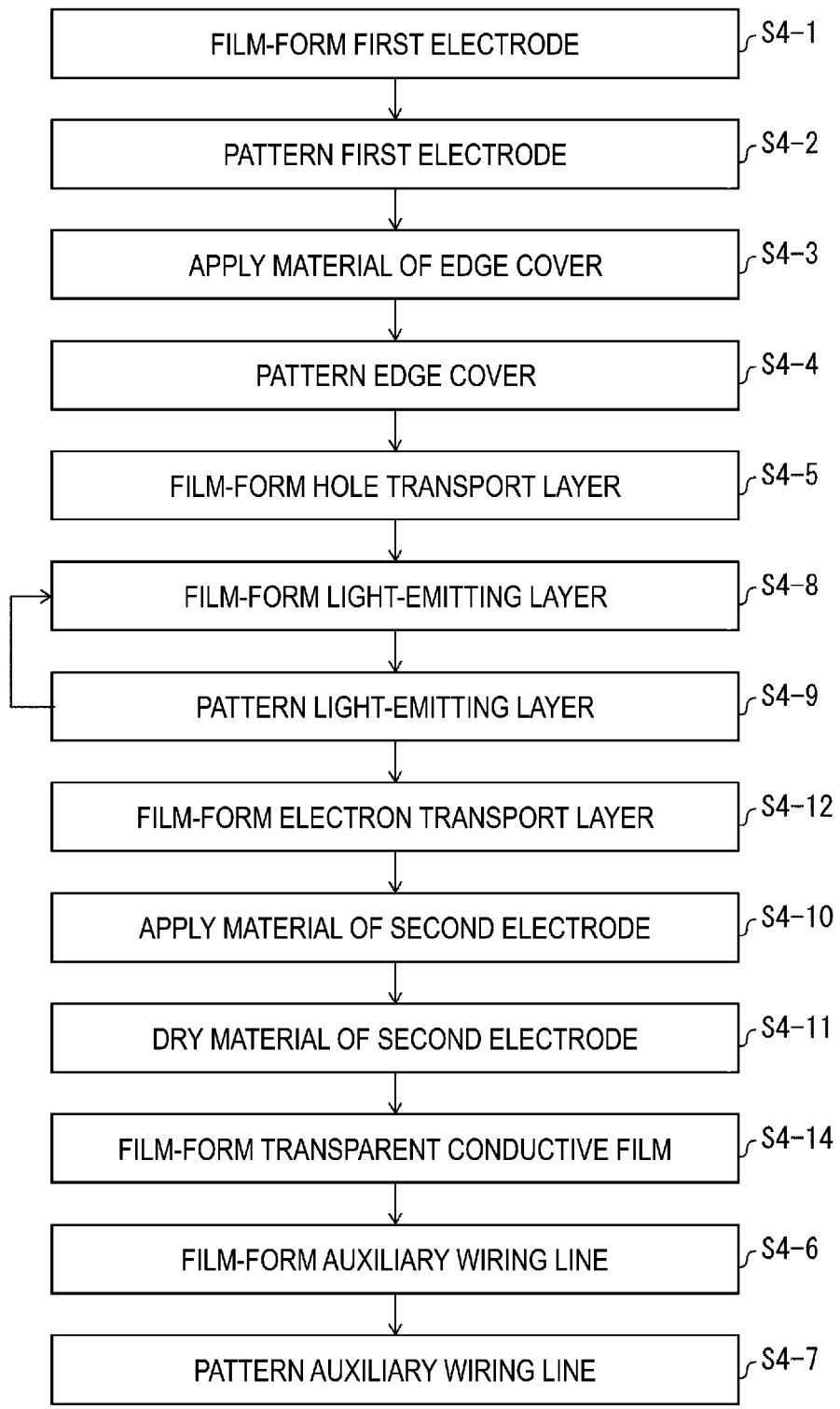
FIG. 16 is a flowchart illustrating in more detail formation of a light-emitting element layer in a manufacturing method for the display device according to the fourth embodiment.
Figure 17:
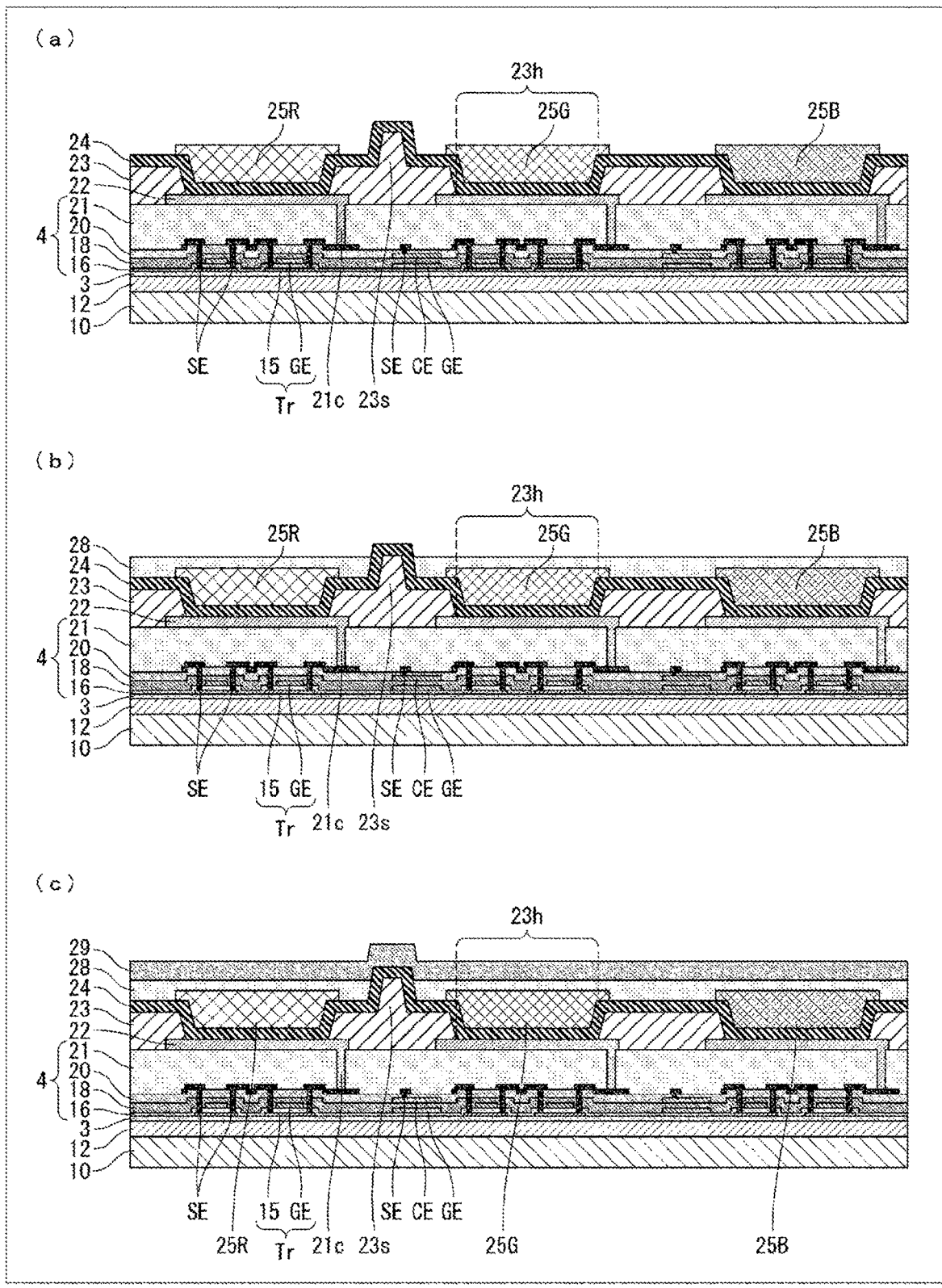
FIG. 17 is a step cross-sectional view illustrating the manufacturing method for the display device according to the fourth embodiment.
Figure 18:
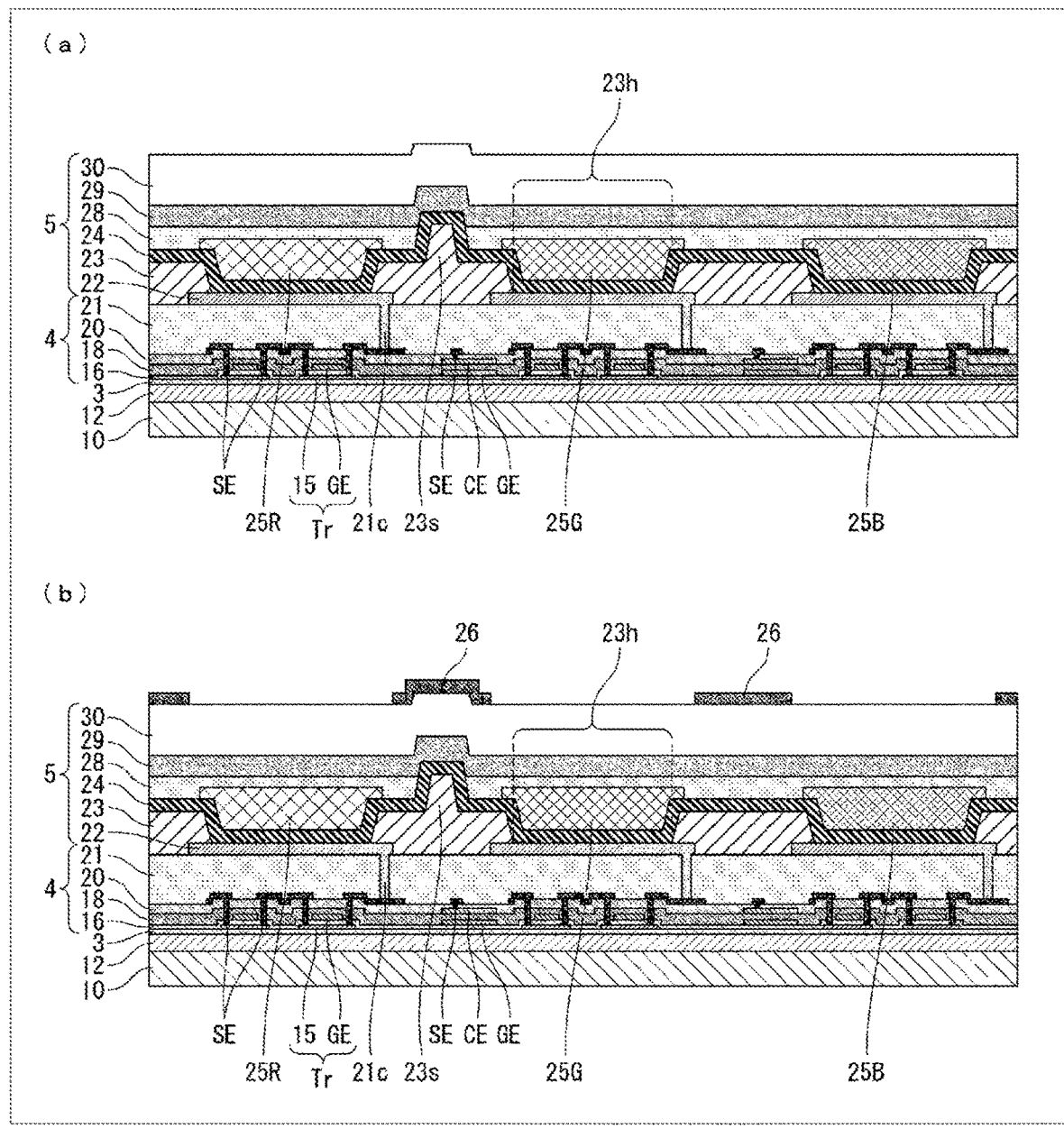
FIG. 18 is another step cross-sectional view illustrating the manufacturing method for the display device according to the fourth embodiment.

The display device 2 according to the present embodiment may be manufactured by the same method except for step S4 among the steps illustrated in the flowchart in FIG. 4. FIG. 16 is a flowchart for describing a method for forming the light-emitting element layer 5 of the display device 2 according to the present embodiment. FIG. 17 and FIG. 18 are step cross-sectional views for describing the steps of forming the light-emitting element layer 5 in more detail, which are executed based on the flowchart in FIG. 16.

As illustrated in FIG. 16, the steps of forming the light-emitting element layer 5 according to the present embodiment can be manufactured by the same method up to the formation of the light-emitting layer 25 in comparison to the steps of forming the light-emitting element layer 5 according to the previous embodiment. At a point in time of completion up to the formation of the light-emitting layer 25, a structure illustrated in (a) of FIG. 17 is obtained.

After the formation of the light-emitting layer 25, in the present embodiment, step S4-12 is executed to film-form the electron transport layer 28. At a point in time of completion of step S4-12, a structure illustrated in (b) of FIG. 17 is obtained. Note that, in the present embodiment, patterning of the electron transport layer 28 may not be performed.

Next, step S4-10 and step S4-11 are executed to form the second electrode 29 illustrated in (c) of FIG. 17. Next, the transparent conductive film 30 illustrated in (a) of FIG. 18 is formed in the upper layer of the second electrode 29 (step S4-14). The transparent conductive film 30 may be formed by using CVD, sputtering, or the like. Next, step S4-6 and step S4-7 are executed to form the auxiliary wiring line 26 illustrated in (b) of FIG. 18 in the upper layer of the transparent conductive film 30. As described above, the light-emitting element layer 5 according to the present embodiment is formed.

In the present embodiment, the transparent conductive film 30 is formed in the upper layer of the second electrode 29, and the auxiliary wiring line 26 is formed in the upper layer of the transparent conductive film 30. Thus, the transparent conductive film 30 protects the lower layer underlying the transparent conductive film 30, including the second electrode 29. Therefore, damage to the lower layer underlying the transparent conductive film 30 due to patterning of the auxiliary wiring line 26 is reduced. Particularly, the transparent conductive film 30 can more efficiently protect the second electrode 29 including a metal nanowire that is susceptible to damage due to patterning of the auxiliary wiring line 26.

The light-emitting element layer 5 of the display device 2 according to each of the embodiments described above may have flexibility and be bendable. For example, the light-emitting element layer 5 according to each of the embodiments described above may include an organic light-emitting diode (OLED) as a light-emitting element. In this case, the display device 2 according to each of the embodiments may be an organic electro luminescent (EL) display.

Alternatively, the light-emitting element layer 5 according to each of the embodiments described above may include a quantum dot light emitting diode (QLED) as a light-emitting element. In this case, the display device 2 according to each of the embodiments described above may be a QLED display.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
a display region including, on a substrate, a thin film transistor (TFT) layer, a light-emitting element layer including a plurality of light-emitting elements, and a sealing layer in this order;
a frame region around the display region; and
a stem wiring line in the frame region,
wherein the light-emitting element layer further includes:
for each of the plurality of light-emitting elements, a first electrode and a plurality of openings exposing the first electrode,
an edge cover covering an end portion of the first electrode,
a plurality of light-emitting layers covering each of the plurality of openings, and
a second electrode that is common to the plurality of light-emitting elements and covers the plurality of light-emitting layers,
the second electrode includes a metal nanowire,
the light-emitting element layer further includes an auxiliary wiring line in a lattice pattern in a position overlapping the edge cover,
the auxiliary wiring line and the metal nanowire are electrically connected to each other, and
the auxiliary wiring line branches from the stem wiring line, and extends from the frame region to the display region.

2. The display device according to claim 1, wherein the metal nanowire is a silver nanowire.

3. The display device according to claim 1, wherein a conductive film and the stem wiring line are electrically connected to each other, the conductive film comprising a same material as that of the first electrode and being in a same layer as the first electrode.

4. The display device according to claim 1, wherein the second electrode further includes an electron transport material.

5. The display device according to claim 1, wherein the light-emitting element layer further includes an inorganic hole transport layer between the first electrode and each of the plurality of light-emitting layers.

6. The display device according to claim 1, wherein the light-emitting element layer further includes an electron transport layer provided in an island shape between each of the plurality of light-emitting layers and the second electrode.

7. The display device according to claim 1, wherein the light-emitting element layer further includes a transparent conductive film that is common to the plurality of light-emitting layers and that is provided in a position covering the second electrode, and
the auxiliary wiring line is electrically connected to the metal nanowire via the transparent conductive film.

8. The display device according to claim 1,
the stem wiring line is electrically connected to a conductive film that comprises a same material as that of the first electrode and that is in a same layer as the first electrode,
the light-emitting element layer further includes a transparent conductive film that is common to the plurality of light-emitting layers and that is provided in a position covering the second electrode, and the auxiliary wiring line is electrically connected to the metal nanowire via the transparent conductive film, and the stem wiring line is electrically connected to the conductive film via the transparent conductive film.

9. The display device according to claim 1,
wherein each of the plurality of light-emitting layers includes a quantum dot and a photosensitive resin.

10. A display device comprising:
a display region including, on a substrate, a thin film transistor (TFT) layer, a light-emitting element layer including a plurality of light-emitting elements, and a sealing layer in this order; and
a frame region around the display region,
wherein the light-emitting element layer further includes:
for each of the plurality of light-emitting elements, a first electrode and a plurality of openings exposing the first electrode,
an edge cover covering an end portion of the first electrode,
a plurality of light-emitting layers covering each of the plurality of openings, and
a second electrode that is common to the plurality of light-emitting elements and covers the plurality of light-emitting layers,
the second electrode includes a metal nanowire,
the light-emitting element layer further includes an auxiliary wiring line in a lattice pattern in a position overlapping the edge cover,
the auxiliary wiring line and the metal nanowire are electrically connected to each other,
the light-emitting element layer further includes an inorganic hole transport layer between the first electrode and each of the plurality of light-emitting layers,
the inorganic hole transport layer that is common to the plurality of light-emitting layers, and
the inorganic hole transport layer is provided on a sealing layer side of the edge cover, and is in contact with the auxiliary wiring line.

11. The display device according to claim 10, wherein the metal nanowire is a silver nanowire.

12. The display device according to claim 10, further comprising:
a stem wiring line in the frame region,
wherein the auxiliary wiring line branches from the stem wiring line, and extends from the frame region to the display region.

13. A display device comprising:
a display region including, on a substrate, a thin film transistor (TFT) layer, a light-emitting element layer including a plurality of light-emitting elements, and a sealing layer in this order; and
a frame region around the display region,
wherein the light-emitting element layer further includes:
for each of the plurality of light-emitting elements, a first electrode and a plurality of openings exposing the first electrode,
an edge cover covering an end portion of the first electrode,
a plurality of light-emitting layers covering each of the plurality of openings, and
a second electrode that is common to the plurality of light-emitting elements and covers the plurality of light-emitting layers,
the second electrode includes a metal nanowire,
the light-emitting element layer further includes an auxiliary wiring line in a lattice pattern in a position overlapping the edge cover,
the auxiliary wiring line and the metal nanowire are electrically connected to each other, and each of the plurality of light-emitting layers includes a quantum dot and a photosensitive resin.

14. The display device according to claim 13, wherein the metal nanowire is a silver nanowire.

15. The display device according to claim 13, further comprising:
a stem wiring line in the frame region,
wherein the auxiliary wiring line branches from the stem wiring line, and extends from the frame region to the display region.

16. The display device according to claim 13, wherein the second electrode further includes an electron transport material.

17. The display device according to claim 13, wherein the light-emitting element layer further includes an inorganic hole transport layer between the first electrode and each of the plurality of light-emitting layers.

18. The display device according to claim 13, wherein the light-emitting element layer further includes an electron transport layer provided in an island shape between each of the plurality of light-emitting layers and the second electrode.

19. The display device according to claim 13, wherein the light-emitting element layer further includes a transparent conductive film that is common to the plurality of light-emitting layers and that is provided in a position covering the second electrode, and
the auxiliary wiring line is electrically connected to the metal nanowire via the transparent conductive film.

20. The display device according to claim 13, further comprising:
a stem wiring line in the frame region,
wherein the auxiliary wiring line branches from the stem wiring line, and extends from the frame region to the display region,
the stem wiring line is electrically connected to a conductive film that comprises a same material as that of the first electrode and that is in a same layer as the first electrode,
the light-emitting element layer further includes a transparent conductive film that is common to the plurality of light-emitting layers and that is provided in a position covering the second electrode,
the auxiliary wiring line is electrically connected to the metal nanowire via the transparent conductive film, and
the stem wiring line is electrically connected to the conductive film via the transparent conductive film.

* * * * *